(12) United States Patent
Niwa

(10) Patent No.: US 10,666,284 B2
(45) Date of Patent: May 26, 2020

(54) SOLID-STATE IMAGING APPARATUS AND ELECTRONIC EQUIPMENT

(71) Applicant: SONY SEMICONDUCTOR SOLUTIONS CORPORATION, Kanagawa (JP)

(72) Inventor: Atsumi Niwa, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/315,343

(22) PCT Filed: Jul. 7, 2017

(86) PCT No.: PCT/JP2017/024891
§ 371 (c)(1),
(2) Date: Jan. 4, 2019

(87) PCT Pub. No.: WO2018/016344
PCT Pub. Date: Jan. 25, 2018

(65) Prior Publication Data
US 2019/0260385 A1    Aug. 22, 2019

(30) Foreign Application Priority Data

Jul. 21, 2016  (JP) .................................. 2016-143269

(51) Int. Cl.
*H03M 1/12*      (2006.01)
*H03M 1/56*      (2006.01)
(Continued)

(52) U.S. Cl.
CPC ............... *H03M 1/56* (2013.01); *H03M 1/12* (2013.01); *H04N 5/374* (2013.01); *H04N 5/378* (2013.01)

(58) Field of Classification Search
CPC ...... H03M 1/66; H03M 13/2707; H03M 1/12; H03M 1/00; H04N 5/374; H04N 7/1693;
(Continued)

(56) References Cited

U.S. PATENT DOCUMENTS 6,215,948 B1 *  4/2001  Watanabe .............. H04N 5/772
                                                     358/906
6,522,359 B1    2/2003  Yamashita
(Continued)

FOREIGN PATENT DOCUMENTS

EP          1282306 A1      2/2003
JP          04-365110 A    12/1992
(Continued)

OTHER PUBLICATIONS

International Search Report and Written Opinion of PCT Application No. PCT/JP2017/024891, dated Sep. 26, 2017, 8 pages of ISRWO.

*Primary Examiner* — Linh V Nguyen
(74) *Attorney, Agent, or Firm* — Chip Law Group

(57) ABSTRACT

The present disclosure relates to a solid-state imaging apparatus and electronic equipment which can realize operation with lower power consumption in a sensing mode. A solid-state imaging apparatus has an A/D conversion unit that A/D converts a pixel signal and an oscillator that generates a second internal clock with a frequency lower than that of a first internal clock obtained by multiplying an external clock, in which the A/D conversion unit is configured to operate, when operating by the second internal clock, with resolution lower than resolution of A/D conversion when operating by the first internal clock. The present disclosure can be applied to, for example, a CMOS image sensor.

13 Claims, 20 Drawing Sheets

(51) Int. Cl.
*H04N 5/374* (2011.01)
*H04N 5/378* (2011.01)

(58) Field of Classification Search
CPC ............. H04N 7/1696; H04N 21/2383; H04N 21/4382; H04N 5/0736; H04N 9/475; H04N 5/378
USPC .................................. 341/141, 142, 155, 161
See application file for complete search history.

(56) References Cited

U.S. PATENT DOCUMENTS

| | | | | |
|---|---|---|---|---|
| 6,700,570 | B2* | 3/2004 | Tachibana | G09G 5/008 345/213 |
| 6,791,623 | B1* | 9/2004 | Masuda | H04N 5/126 348/563 |
| 2005/0062864 | A1* | 3/2005 | Mabuchi | H04N 3/155 348/294 |
| 2010/0020211 | A1* | 1/2010 | Inada | H03M 1/1023 348/294 |
| 2010/0225796 | A1* | 9/2010 | Lim | H03M 1/0607 348/308 |
| 2011/0074994 | A1* | 3/2011 | Wakabayashi | H03M 1/0658 348/302 |
| 2011/0285429 | A1 | 11/2011 | Kawanaka et al. | |
| 2012/0305751 | A1* | 12/2012 | Kusuda | H04N 5/35509 250/208.1 |
| 2015/0014517 | A1* | 1/2015 | Ikebe | H03M 1/14 250/208.1 |
| 2015/0028190 | A1* | 1/2015 | Shin | H03K 21/38 250/208.1 |
| 2015/0123702 | A1* | 5/2015 | McKinley | H01L 21/265 326/8 |
| 2016/0117584 | A1* | 4/2016 | Yoneda | G06K 19/07707 235/492 |
| 2016/0249004 | A1* | 8/2016 | Saeki | H03M 1/123 |
| 2018/0352178 | A1* | 12/2018 | Kato | H04N 5/374 |

FOREIGN PATENT DOCUMENTS

| | | |
|---|---|---|
| JP | 08-228280 A | 9/1996 |
| JP | 2012-009011 A | 1/2012 |

* cited by examiner

SOLID-STATE IMAGING APPARATUS AND ELECTRONIC EQUIPMENT

CROSS REFERENCE TO RELATED APPLICATIONS

This application is a U.S. National Phase of International Patent Application No. PCT/JP2017/024891 filed on Jul. 7, 2017, which claims priority benefit of Japanese Patent Application No. JP 2016-143269 filed in the Japan Patent Office on Jul. 21, 2016. Each of the above-referenced applications is hereby incorporated herein by reference in its entirety.

TECHNICAL FIELD

The present disclosure relates to a solid-state imaging apparatus and electronic equipment, and particularly to a solid-state imaging apparatus and electronic equipment which can realize operation with low power consumption.

BACKGROUND ART

In recent years, demands for lowering power consumption of mobile equipment and wearable devices have been increasing as applications increase.

In response to this, a system, which operates in a sensing mode (low resolution imaging mode) that can withstand constant activation and performs simple recognition with lower power consumption, in addition to an imaging mode with higher power consumption, has been developed for a solid-state imaging apparatus such as a CMOS image sensor. Accordingly, power can be consumed only when necessary to perform imaging, enabling autonomous optimization of power.

Normally, the power consumption of a processor that controls various chips is high in the entire camera system. Therefore, in order to realize constant activation of the solid-state imaging apparatus in the sensing mode, it is important to perform autonomous operation and bring the processor to a halting state from a viewpoint of power consumption reduction. In this case, the solid-state imaging apparatus is demanded to perform self-running operation in a state where clock supply is stopped.

As a technology relating to the self-running operation, for example, Cited Document 1 discloses a circuit configuration that stops an external clock at arbitrary timing and generates an internal clock.

CITATION LIST

Patent Document

Patent Document 1: Japanese Patent Application Laid-Open No. H4-365110

SUMMARY OF THE INVENTION

Problems to be Solved by the Invention

However, there has been no proposal of a solid-state imaging apparatus that performs self-running operation in a sensing mode and transitions to an imaging mode to operate by being supplied an external clock when a moving body is detected by sensing. Such a solid-state imaging apparatus can be applied to a surveillance camera system or the like.

The present disclosure has been made in light of such a situation to realize operation with lower power consumption.

Solutions to Problems

A solid-state imaging apparatus according to a first aspect of the present disclosure includes: an A/D conversion unit that A/D converts a pixel signal; and an oscillator that generates a second internal clock with a frequency lower than that of a first internal clock obtained by multiplying an external clock, in which the A/D conversion unit is configured to operate, when operating by the second internal clock, with resolution lower than resolution of A/D conversion when operating by the first internal clock.

Electronic equipment according to a first aspect of the present disclosure includes a solid-state imaging apparatus having: an A/D conversion unit that A/D converts a pixel signal; and an oscillator that generates a second internal clock with a frequency lower than that of a first internal clock obtained by multiplying an external clock, in which the A/D conversion unit is configured to operate, when operating by the second internal clock, with resolution lower than resolution of A/D conversion when operating by the first internal clock.

In the first aspect of the present disclosure, the A/D conversion unit is configured to operate, when operating by the second internal clock, with the resolution lower than the resolution of A/D conversion when operating by the first internal clock.

A solid-state imaging apparatus according to a second aspect of the present disclosure includes: an A/D conversion unit that A/D converts a pixel signal; a first oscillator that generates a first internal clock; and a second oscillator that generates a second internal clock with a frequency higher than that of the first internal clock, in which the second oscillator is configured to be activated only during an A/D conversion period, in which the A/D conversion unit operates, and operates by the second internal clock during the A/D conversion period.

Electronic equipment according to a second aspect of the present disclosure includes a solid-state imaging apparatus having: an A/D conversion unit that A/D converts a pixel signal; a first oscillator that generates a first internal clock; and a second oscillator that generates a second internal clock with a frequency higher than that of the first internal clock, in which the second oscillator is configured to be activated only during an A/D conversion period, in which the A/D conversion unit operates, and operates by the second internal clock during the A/D conversion period.

In the second aspect of the present disclosure, the second oscillator is configured to be activated only during the A/D conversion period, in which the A/D conversion unit operates, and operates by the second internal clock during the A/D conversion period.

Effects of the Invention

According to the present disclosure, it is possible to realize the operation with lower power consumption in the sensing mode.

MODE FOR CARRYING OUT THE INVENTION

Hereinafter, preferred embodiments of the present disclosure will be described in detail with reference to the drawings. Note that, in the specification and the drawings, constituents having substantially the same functional configurations are denoted by the same reference signs to omit redundant explanations.

Moreover, the description will be given in the following order.

1. About Conventional CMOS Image Sensor
2. Configuration of CMOS Image Sensor of Present Disclosure
3. First Embodiment
4. Second Embodiment
5. Structure of Image Sensor
6. Configuration Example of Electronic Equipment
7. Usage Examples of Image Sensor
8. Application Example 1
9. Application example 2

1. About Conventional CMOS Image Sensor

Figure 1:
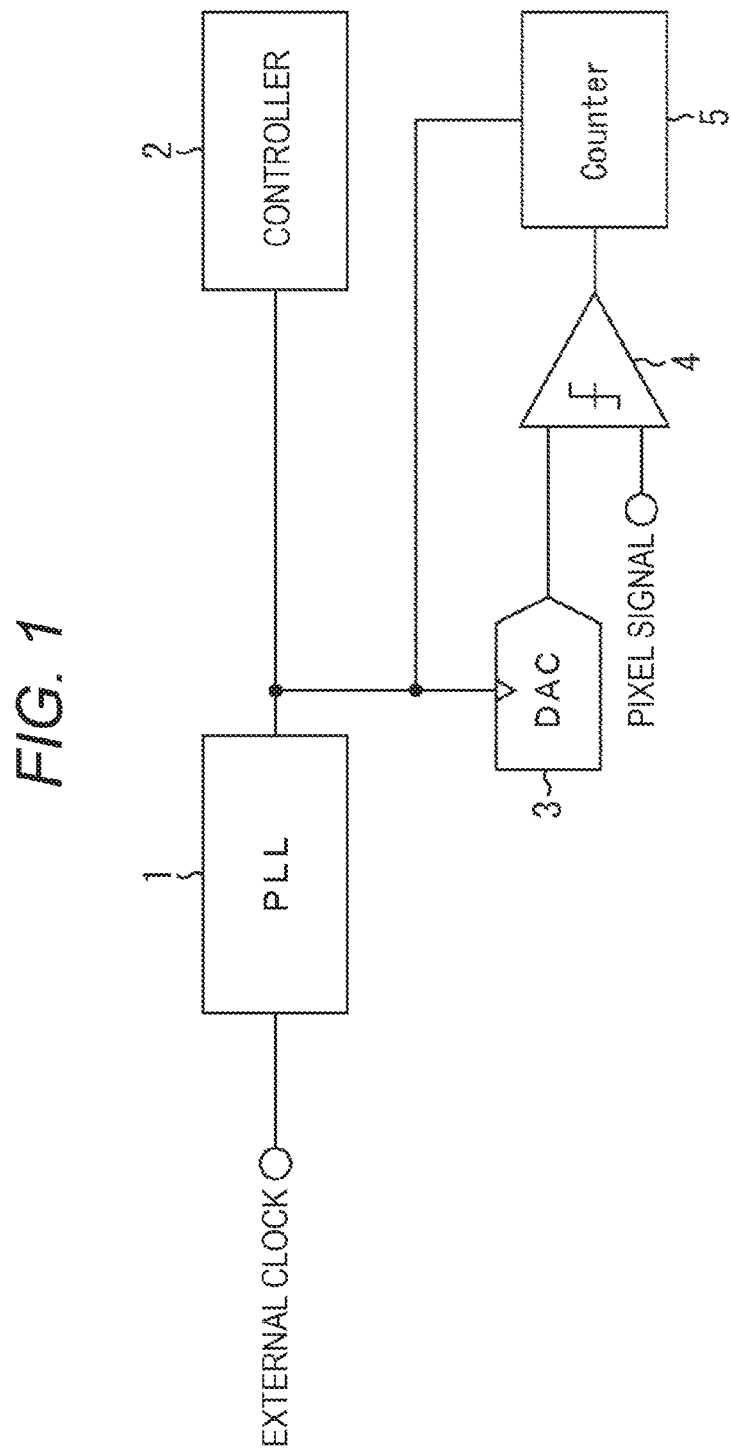
FIG. 1 is a block diagram showing a configuration example of a conventional CMOS image sensor.

FIG. 1 shows a configuration example of a conventional complementary metal oxide semiconductor (CMOS) image sensor.

In the CMOS image sensor shown in FIG. 1, a phase-locked loop (PLL) circuit 1 multiplies a reference clock (external clock) from the outside to a necessary frequency and supplies the clock to a controller 2, a digital-to-analog converter (DAC) 3 and a counter 5. The clock signal outputted from the PLL circuit 1 is set to about several hundred MHz to about several GHz.

The DAC 3, a comparator 4 and the counter 5 constitute an A/D conversion unit. Among them, the comparator 4 and the counter 5 constitute a column A/D conversion circuit, and a pixel signal supplied to each column from a pixel array (not shown) is compared with a reference signal from the DAC 3 to be converted into a digital signal.

The CMOS image sensor with such configuration is controlled by a digital signal processor (DSP) provided outside, and the external clock is also supplied from the DSP to the PLL circuit 1.

Meanwhile, in recent years, demands for lowering the power consumption of the entire system have been increasing to mount on mobile equipment and wearable devices.

Normally, the power consumption of the DSP is high. Therefore, for the equipment and devices, the system development has become popular, in which various sensors sense the surrounding situation in a state where the DSP is halted, and the DSP is activated by outputting an interrupt signal to the DSP in a case where a change in the situation is detected.

Therefore, the CMOS image sensor is also demanded to operate in a state where the DSP is halted, that is, in a state where the external clock is not supplied.

Thereupon, the configuration of a CMOS image sensor operable in a state where an external clock is not supplied will be described hereinafter.

2. Configuration of CMOS Image Sensor of Present Disclosure

Figure 2:
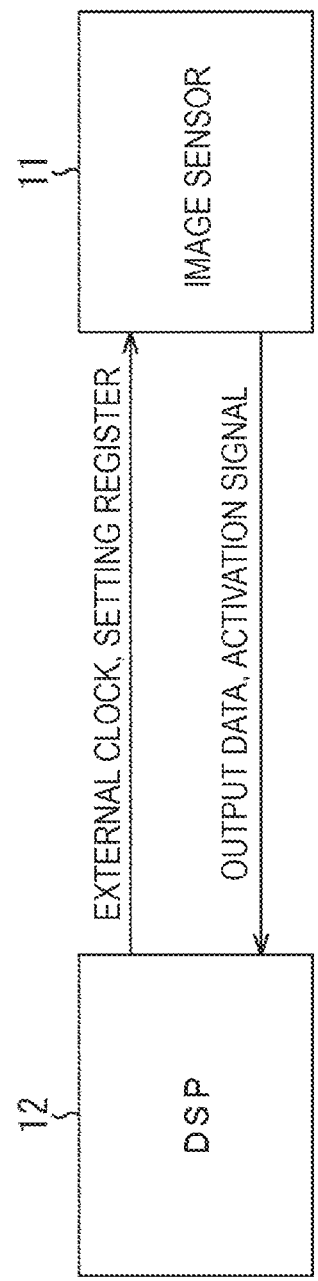
FIG. 2 is a diagram showing a relationship between a CMOS image sensor and a DSP.

FIG. 2 is a diagram showing a relationship between a CMOS image sensor and a DSP of the present disclosure.

A CMOS image sensor 11 shown in FIG. 2 is one example of a solid-state imaging apparatus of the present disclosure. It is needless to say that the solid-state imaging apparatus of the present disclosure may be applied to an image sensor with different configuration.

The CMOS image sensor 11 (hereinafter, simply referred to as the image sensor 11) is controlled by a DSP 12. Specifically, the image sensor 11 operates by receiving the supply of an external clock and a value of a setting register from the DSP 12 and supplies output data to the DSP 12.

Moreover, the image sensor 11 operates in one of operation modes, a normal imaging mode and a sensing mode (low resolution imaging mode) that performs simple recognition with low power consumption.

In the imaging mode, the image sensor 11 operates by a first internal clock obtained by multiplying the external clock supplied from the DSP 12 to a necessary frequency. On the other hand, in the sensing mode, the image sensor 11 operates by a clock (second internal clock) by an internal oscillator (self-running operation). Note that the DSP 12 is halted in the sensing mode.

When the operation mode of the image sensor 11 operating by the second internal clock transitions to the imaging mode from the sensing mode, the image sensor 11 supplies an activation signal (interrupt signal) to the DSP 12. The DSP 12 is activated by the activation signal from the image sensor 11, and the image sensor 11 operates in the imaging mode by the first internal clock obtained by multiplying the external clock from the activated DSP 12 to a necessary frequency.

3. First Embodiment

Here, with reference to FIGS. 3 and 4, a configuration example of an image sensor 11 according to a first embodiment will be described.

Figure 3:
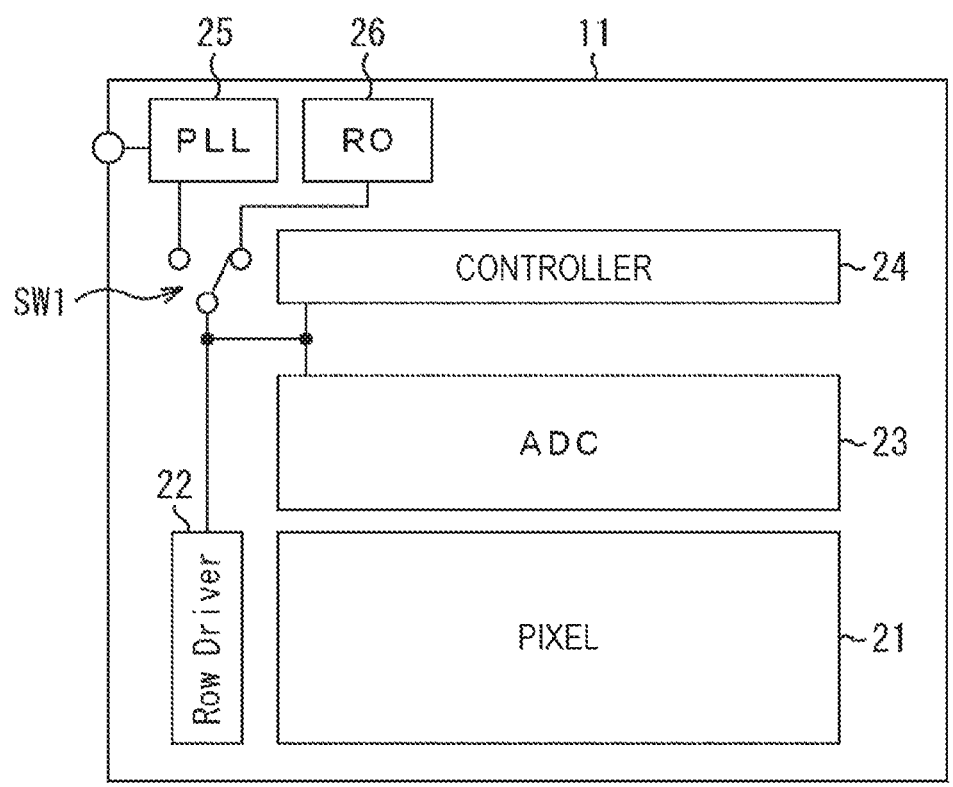
FIG. 3 is a block diagram showing a configuration example of a CMOS image sensor according to a first embodiment.

An image sensor 11 shown in FIG. 3 includes a pixel array 21, a row driving circuit 22, an A/D conversion unit (ADC) 23, a controller 24, a PLL circuit 25 and an oscillator 26. These constituents are formed on a semiconductor substrate (chip) (not shown).

In the image sensor 11, light incident on the pixel array 21 is photoelectrically converted, and a pixel signal is read out from each pixel of the pixel array 21 driven by the row driving circuit 22. Then, the readout pixel signals (analog signals) are analog-to-digital (A/D) converted by the ADC 23, and digital data corresponding to the incident light is outputted.

The pixel array 21 is constituted by arranging, in matrix, pixels having photoelectric conversion elements such as photodiodes. The number of pixels arranged in the pixel array 21 is arbitrary, and the numbers of rows and columns are also arbitrary.

The row driving circuit 22 drives each pixel of the pixel array 21 by units of row. Specifically, the row driving circuit 22 simultaneously drives the pixels of a plurality of pixel rows. A control line (not shown) is formed for each row from the row driving circuit 22 to the pixel array 21.

Figure 4:
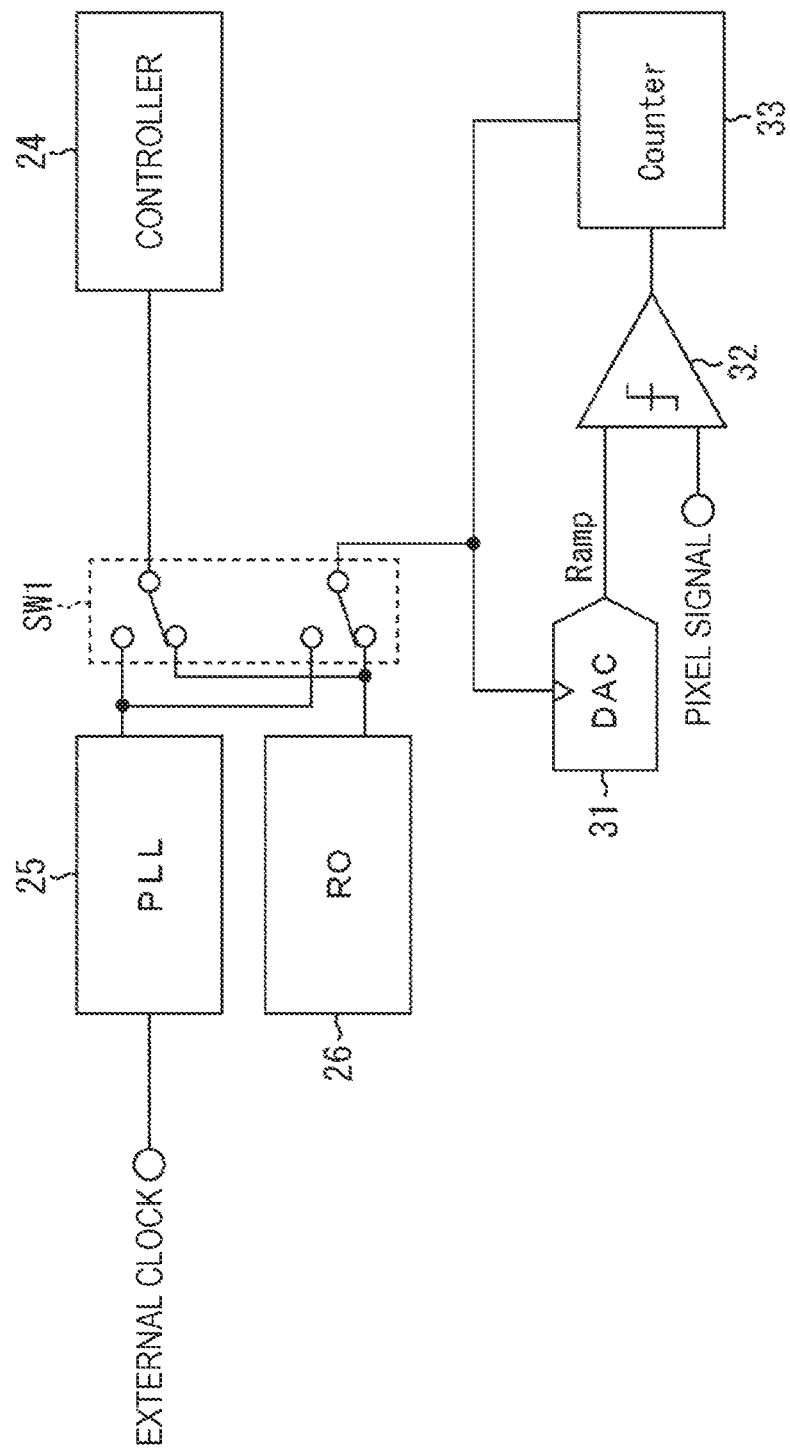
FIG. 4 is a block diagram showing a configuration example of the CMOS image sensor according to the first embodiment.

The ADC 23 is constituted by a DAC 31, a comparator 32 and a counter 33 shown in FIG. 4 and A/D converts the analog pixel signal read out from each pixel in each column of the pixel array 21. Moreover, the ADC 23 includes a column A/D conversion circuit provided for each column of the pixel array 21.

Each column of a general pixel array is provided with a vertical signal line that supplies a pixel signal to the column A/D conversion circuit. The pixel signals outputted to the respective vertical signal lines are supplied to the respective column A/D conversion circuits of the ADC 23.

The column A/D conversion circuit is constituted by the comparator 32 and the counter 33 shown in FIG. 4, and a pixel signal supplied to each column is compared with a reference signal (ramp signal) from the DAC 31 to be converted into a digital signal. That is, the ADC 23 operates as a single-slope type A/D converter.

The controller 24 controls the entire image sensor 11 and controls generation of various signals. For example, the controller 24 controls generation of an activation signal for activating the DSP 12 that is halted in the sensing mode.

In the imaging mode, the PLL circuit 25 multiplies the external clock supplied from the DSP 12 to a necessary frequency and supplies the clock to the row driving circuit 22, the ADC 23 and the controller 24. That is, in the imaging mode, the row driving circuit 22, the ADC 23 and the controller 24 operate by the first internal clock obtained by multiplying the external clock to a necessary frequency.

In the sensing mode, the oscillator 26 generates a second internal clock with a frequency lower than that of the first internal clock outputted from the PLL circuit 25 and supplies the second internal clock to the row driving circuit 22, the ADC 23 and the controller 24. That is, in the sensing mode, the row driving circuit 22, the ADC 23 and the controller 24 operate by the second internal clock.

Whether the first internal clock from the DSP 12 is supplied or the second internal clock from the oscillator 26 is supplied to the row driving circuit 22, the ADC 23 and the controller 24 is determined by a switch SW1.

Such configuration enables the image sensor 11 to operate without being supplied an external clock in the sensing mode.

Particularly, operation with low power consumption is required in the sensing mode so that operation by a high-speed clock from the PLL circuit 25 is undesirable.

Meanwhile, the ADC 23 in the image sensor 11 is configured as a single-slope type A/D converter. Therefore, it is necessary for the counter 33 to perform count operation according to necessary resolution of A/D conversion in the ADC 23. For example, in a case where the output bit length of the A/D conversion is 10 bits, the counter 33 needs to perform 1024 count operations.

Therefore, in a case where the frequency of the clock is low, the operation time of the A/D conversion becomes longer, resulting in an increase in power consumption. Thereupon, the operation time of the A/D conversion is demanded to be shortened in the sensing mode by lowering the resolution of the A/D conversion.

Figure 5:
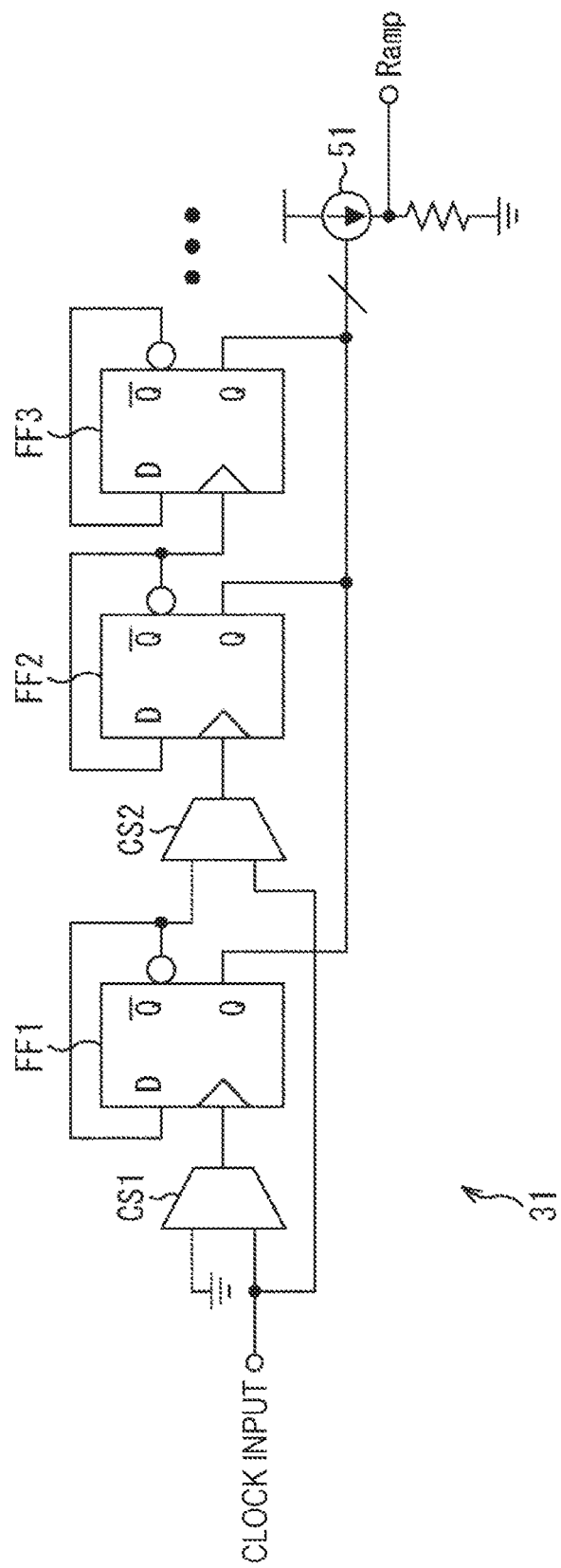
FIG. 5 is a diagram showing a configuration example of the DAC.

FIG. 5 is a diagram showing a configuration example of the DAC 31.

The DAC 31 shown in FIG. 5 is constituted by clock selectors CS1 and CS2 and flip-flops FF1, FF2, FF3 and so on and a current source 51. Each of the flip-flops FF1, FF2, FF3 and so on performs counting as a binary counter and counts up the number of connections of the current source 51 according to the count values so that the DAC 31 generates a ramp signal.

Figure 6:
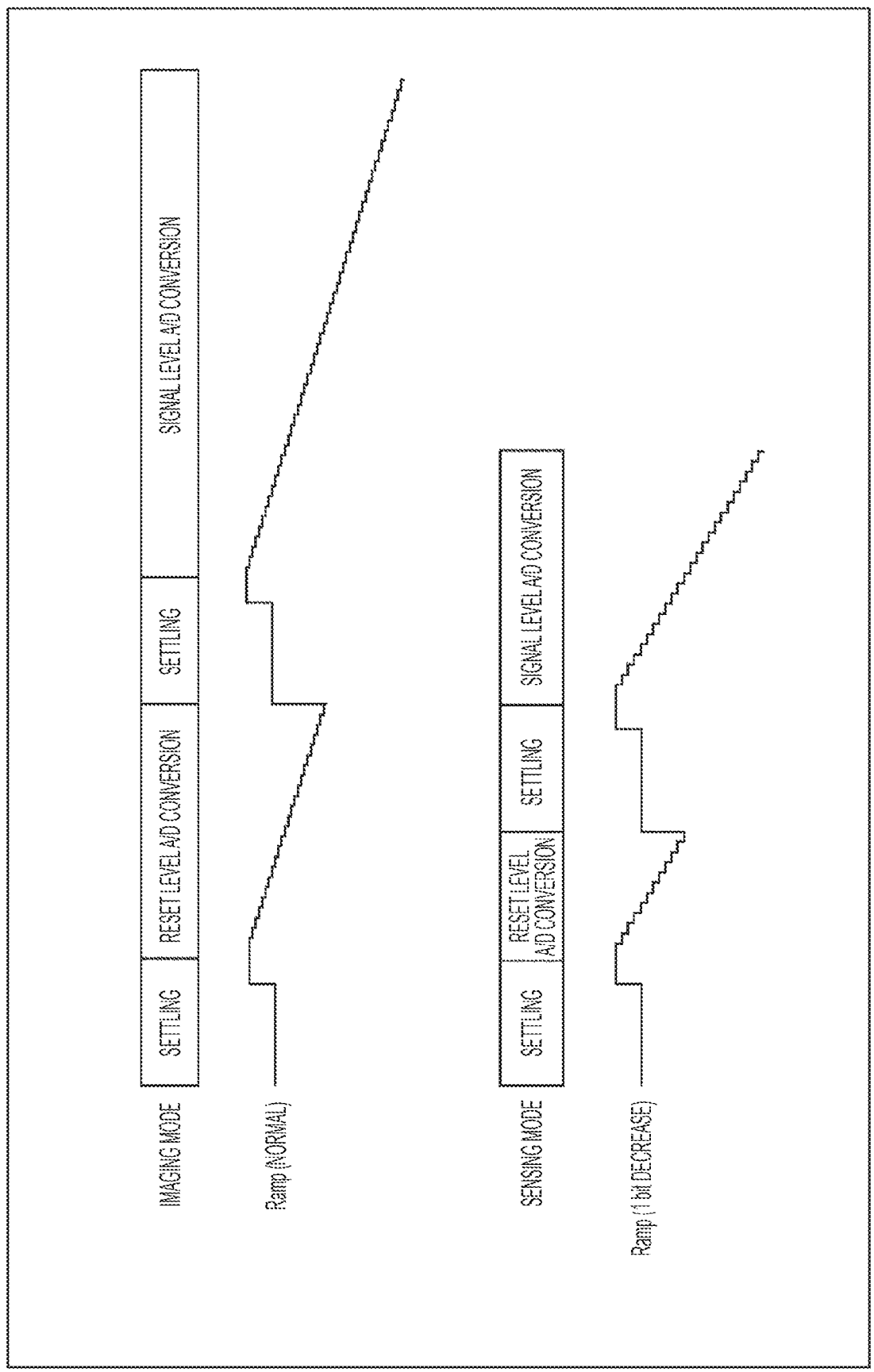
FIG. 6 is a diagram illustrating the operation during an A/D conversion period.

In an A/D conversion period in the imaging mode, all of the flip-flops FF1, FF2, FF3 and so on perform counting so that the DAC 31 generates a ramp signal that changes with a certain slope as shown in the upper part of FIG. 6.

In the A/D conversion period, a pixel signal of a reset level is A/D converted in a period corresponding to the slope of the ramp signal after the first settling is performed, and a pixel signal of a signal level is A/D converted in a period corresponding to the slope of the ramp signal after the second settling is performed.

On the other hand, in an A/D conversion period in the sensing mode, the clock selectors CS1 and CS2 are switched so that the flip-flop FF1 among the flip-flops FF1, FF2, FF3 and so on does not perform counting. That is, the count operation of the least significant bit (LSB) is halted, and the count-up of 2 LSB is performed every clock cycle. Accordingly, as shown in the lower part of FIG. 6, the DAC 31 generates a ramp signal that changes with a slope (doubled slope) greater than the slope of the ramp signal in the imaging mode.

As a result, in the sensing mode, a pixel signal of a reset level and a pixel signal of a signal level are A/D converted in a period shorter than that of the imaging mode without changing the count operation of the counter 33.

According to the above configuration, in the sensing mode, it is possible to reduce the resolution of the A/D conversion and shorten the operation time of the A/D conversion. Thus, the operation with lower power consumption can be realized.

Note that the DAC 31 can be realized by other constituents besides the binary counters as shown in FIG. 5.

Incidentally, charges are accumulated and read out in the sensing mode in a manner similar to the imaging operation in the imaging mode. Accordingly, the auto exposure (AE)

control is simplified, enabling a seamless transition from the sensing mode to the imaging mode.

However, since the frequency precision of the external clock (the first internal clock) is high, the outputs are different even when the light source condition is the same at the time of the imaging mode operation and at the time of the sensing mode operation in a case where the frequency precision of the second internal clock includes an error such as a variation in the elements possessed by the oscillator 26. As a result, the AE control cannot be simplified, and the seamless transition from the sensing mode to the imaging mode becomes difficult.

Figure 7:
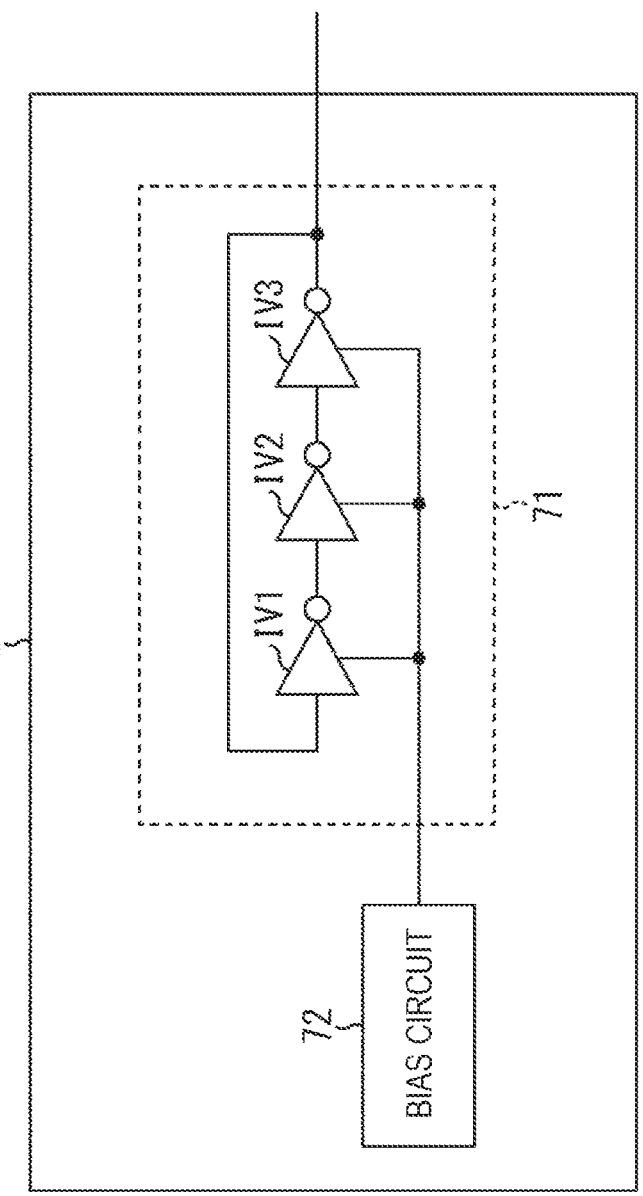
FIG. 7 is a block diagram showing a configuration example of an oscillator.

FIG. 7 is a block diagram showing a configuration example of the oscillator 26.

The oscillator 26 is constituted by an oscillation circuit 71 and a bias circuit 72.

The oscillation circuit 71 is configured as a so-called ring oscillator and constituted by three inverters IV1 to IV3. The bias circuit 72 generates a bias voltage that defines a threshold value of the output of the oscillation circuit 71 and supplies the bias voltage to the inverters IV1 to IV3.

Figure 8:
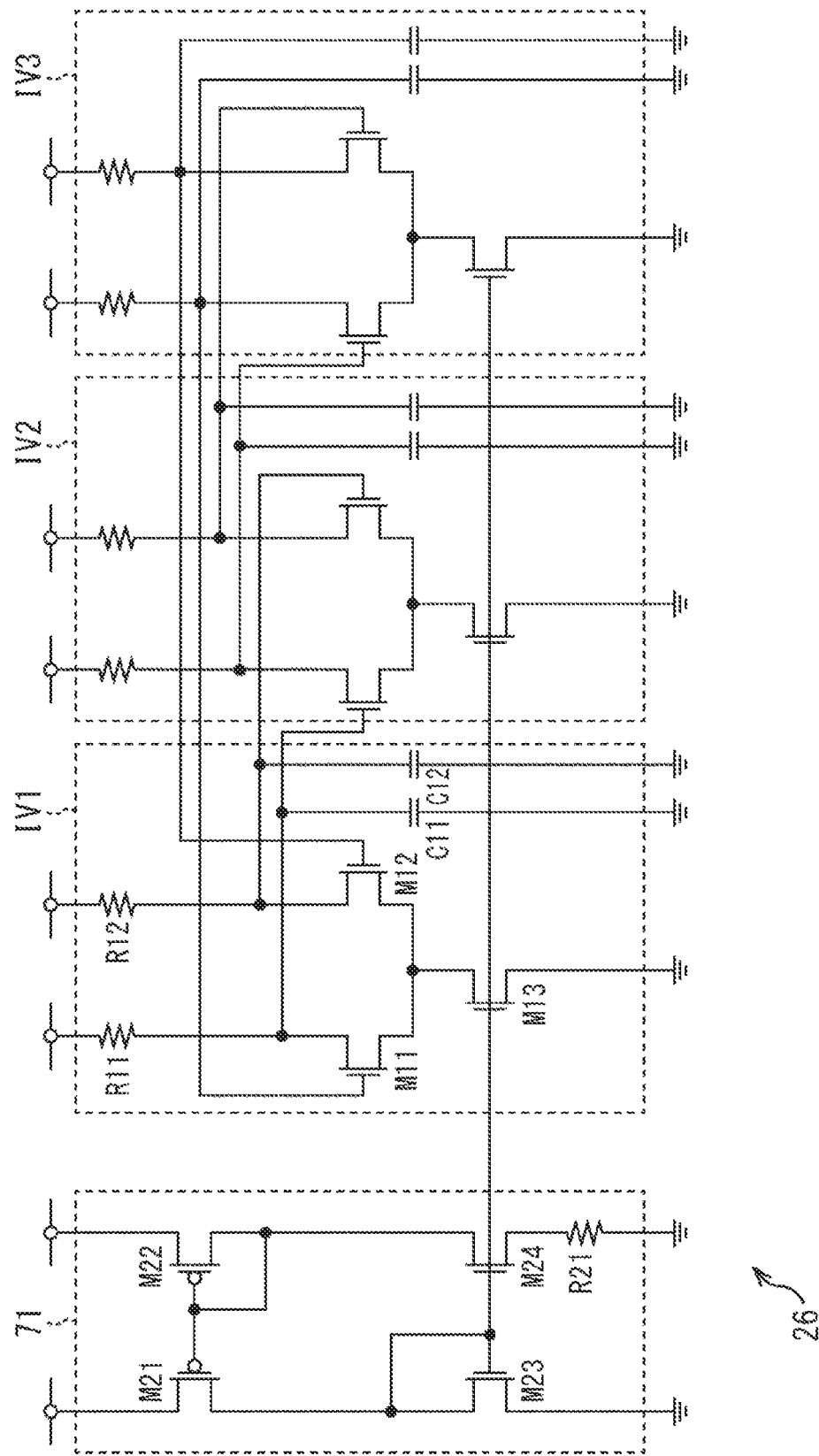
FIG. 8 is a diagram showing a circuit configuration example of the oscillator.

FIG. 8 is a diagram showing a circuit configuration example of the oscillator 26.

In FIG. 8, the inverter IV1 constituting the oscillation circuit 71 is configured as a differential amplifier and has transistors M11 to M13, resistance elements R11 and R12 and capacitance elements C11 and C12. Note that each of the inverters IV1 to IV3 has the same circuit configuration.

The transistors M11 and M12 are differential pairs, and the transistor M13 is a current source. The resistance elements R11 and R12 are connected between predetermined power sources and the transistors M11 and M12, respectively. Moreover, the capacitance elements C11 and C12 are connected between the differential output and GND.

Furthermore, in FIG. 8, the bias circuit 72 has transistors M21 to M24 and a resistance element R21. The transistors M21 and M22 are PMOS transistors, and the transistors M23 and M24 are NMOS transistors.

The gate of the transistor M21 and the gate of the transistor M22 are connected to the drain of the transistor M24. The gate of the transistor M23 and the gate of the transistor M24 are connected to the drain of the transistor M21.

The drain of the transistor M21 is connected to the drain of the transistor M23, and the drain of the transistor M22 is connected to the drain of the transistor M24. Further, the resistance element R21 is connected between the source and GND of the transistor M24.

The voltage at the connection point between the gate of the transistor M23 and the gate of the transistor M24 is outputted as the bias voltage.

Figure 9:
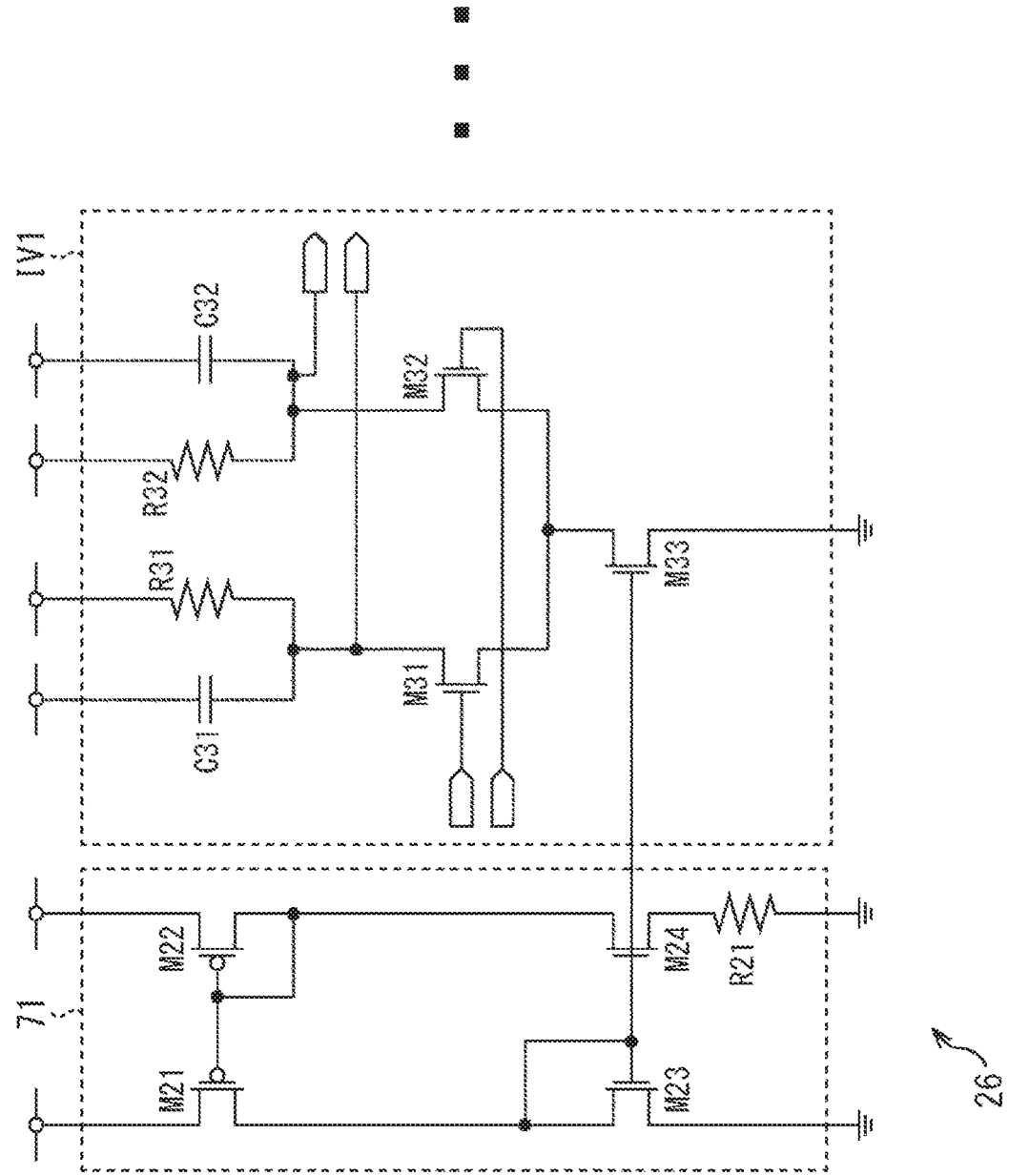
FIG. 9 is a diagram showing another circuit configuration example of the oscillator.

FIG. 9 is a diagram showing another circuit configuration example of the oscillator 26.

FIG. 9 shows only the configuration of the inverter IV1 among inverters IV1 to IV3 constituting the oscillation circuit 71, and the illustration of the inverters IV2 and IV3 is omitted. The inverter IV1 in FIG. 9 has transistors M31 to M33, resistance elements R31 and R32 and capacitance elements C31 and C32.

The transistors M31 and M32 are differential pairs, and the transistor M33 is a current source. The resistance element R31 and the capacitance element C31 are connected in parallel between predetermined power sources and the transistor M31. Moreover, the resistance element R32 and the capacitance element C32 are connected in parallel between predetermined power sources and the transistor M32.

Note that the configuration of a bias circuit 72 shown in FIG. 9 is similar to that of the bias circuit 72 shown in FIG. 8.

In the circuit configurations shown in FIGS. 8 and 9, the oscillating frequency of the second internal clock generated by the oscillator 26 is determined by the resistance values of the resistance elements R11 and R12 and by the capacitance values of the capacitance elements C11 and C12, the resistance elements R11 and R12 and the capacitance elements C11 and C12 being provided in the inverters IV1 to IV3 constituting the oscillation circuit 71.

This makes it possible to reduce errors such as variations in the elements as well as adjust the oscillating frequency of the second internal clock by switching the capacitance values so that a trimming circuit for automatically adjusting the oscillating frequency of the oscillator can be easily added.

Furthermore, since the inverters IV1 to IV3 are each configured as a differential amplifier, it is possible to lessen frequency deviation caused by in-phase noise typified by power source noise.

Further, a bandgap voltage with good precision is necessary to perform the A/D conversion in the imaging mode, but the sensing mode is not limited thereto. Thereupon, by providing the dedicated bias circuit 72 in the oscillator 26 as in the circuit configurations shown in FIGS. 8 and 9, the power consumption used for generating the bias voltage can be reduced.

Note that the oscillator 26 is not limited to the circuit configurations as shown in FIGS. 8 and 9 and can be realized by other circuit configurations.

The aforementioned image sensor 11 operates, in the imaging mode, by the high-speed clock obtained by multiplying the external clock supplied from the outside (DSP 12) and operates, in the sensing mode, by the low-speed clock generated by the oscillator 26 provided therein.

Figure 10:
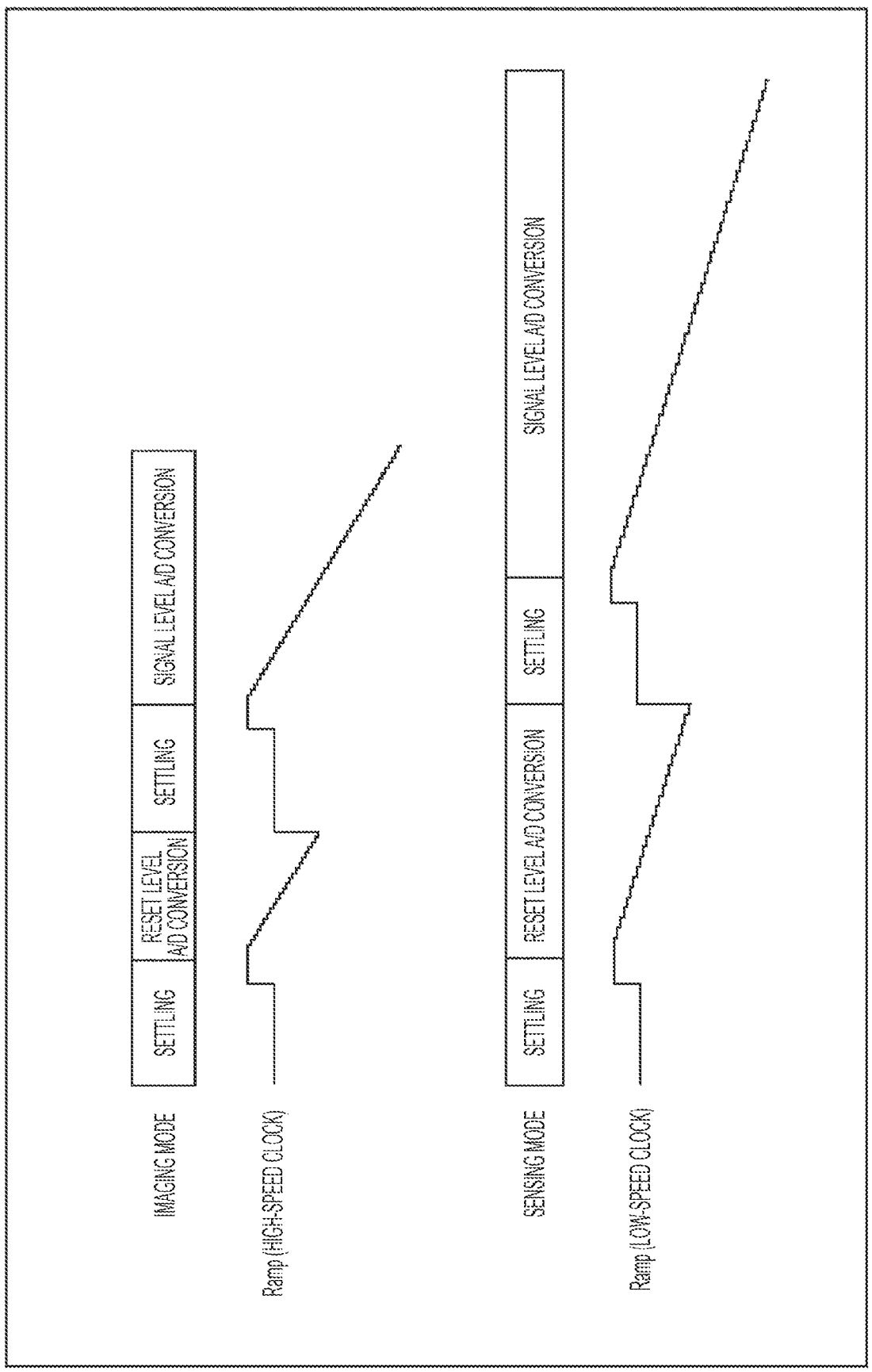
FIG. 10 is a diagram illustrating the operation during an A/D conversion period.

FIG. 10 is a diagram illustrating the operation of the image sensor 11 during the A/D conversion period in each mode.

During the A/D conversion period in the imaging mode, counting is performed based on the high-speed clock obtained by multiplying the external clock according to necessary resolution of the A/D conversion, thereby generating a ramp signal which changes with a certain slope as shown in the upper part of FIG. 10.

On the other hand, during the A/D conversion period in the sensing mode, counting is performed based on the low-speed clock generated by the oscillator 26 according to necessary resolution of the A/D conversion, thereby generating a ramp signal which changes with a slope milder than the slope of the ramp signal in the imaging mode as shown in the lower part of FIG. 10.

That is, in the sensing mode, the period of counting is prolonged, and the A/D conversion operation is delayed. As a result, the ratio of the operation time of the A/D conversion to the entire operation time of the image sensor 11 increases, leading to an increase in power consumption.

Thereupon, the frequency of the internal clock generated by the oscillator 26 is made high, enabling high-speed operation of the A/D conversion. However, since the oscillating frequency and the power consumption generally have a proportional relationship in the oscillator, the power consumption of the oscillator 26 itself increases if the oscillating frequency of the oscillator 26 is made high. That is, there is a trade-off relationship between the power consumption of the A/D conversion unit, which operates by the internal clock, and the power consumption of the oscillator, which generates the internal clock.

Note that the power consumption can be reduced by halting the A/D conversion circuit including the DAC 31 except during the operation time of A/D conversion. However, since the internal clock is necessary for the operation of the logic circuit such as the controller 24 and the frame control such as readout from charge accumulation, the oscillator 26 must be constantly activated.

Thus, it is difficult to further lower the power consumption of the entire image sensor that performs self-running operation by the internal clock.

Thereupon, the configuration, which can further lower the power consumption of the entire image sensor that performs self-running operation by the internal clock, will be described hereinafter.

4. Second Embodiment

Figure 11:
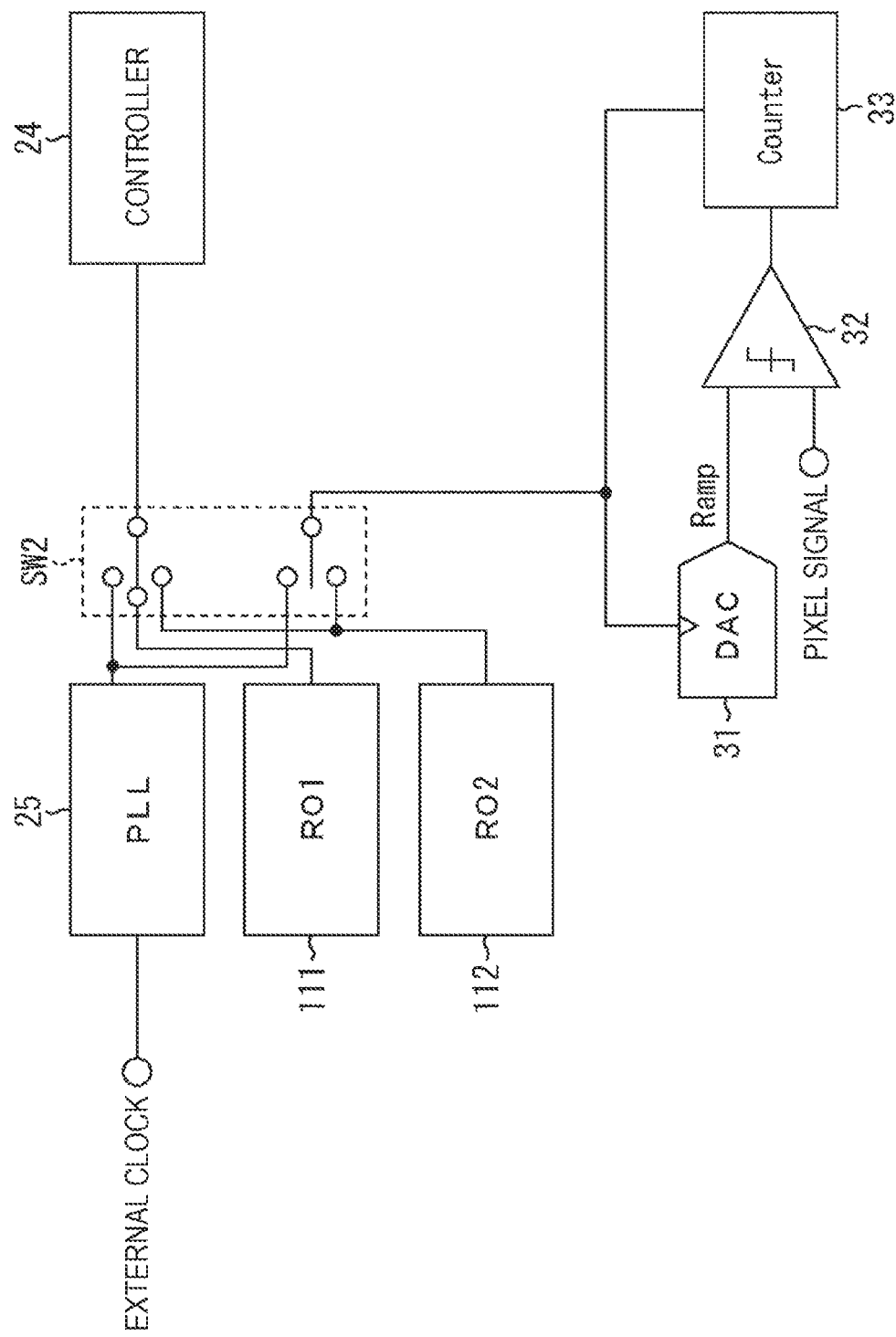
FIG. 11 is a block diagram showing a configuration example of a CMOS image sensor according to a second embodiment.

FIG. 11 is a diagram showing a configuration example of an image sensor 11 according to a second embodiment.

In the image sensor 11 in FIG. 11, a first oscillator 111 and a second oscillator 112 are provided in place of the oscillator 26 in the image sensor 11 in FIG. 4.

The first oscillator 111 is constantly activated and generates a first internal clock of relatively low-speed. The first internal clock is supplied only to a controller 24.

The second oscillator 112 is activated only during an A/D conversion period, in which an ADC 23 constituted by a DAC 31, a comparator 32 and a counter 33 operates, and generates a second internal clock with a frequency higher (of a speed faster) than that of the first internal clock. The second internal clock is supplied to the controller 24, the DAC 31, the comparator 32 and the counter 33.

Note that whether the first internal clock is supplied only to the controller 24 or the second internal clock is supplied to the controller 24, the DAC 31, the comparator 32 and the counter 33 in the sensing mode is determined by a switch SW2.

Specifically, during a period of the operation period other than the A/D conversion period in the sensing mode, as shown in FIG. 11, the first oscillator 111 and the controller 24 are connected by the switch SW2, and the controller 24 as well as the entire image sensor 11 except for the ADC 23 operate by the first internal clock of low-speed.

Figure 12:
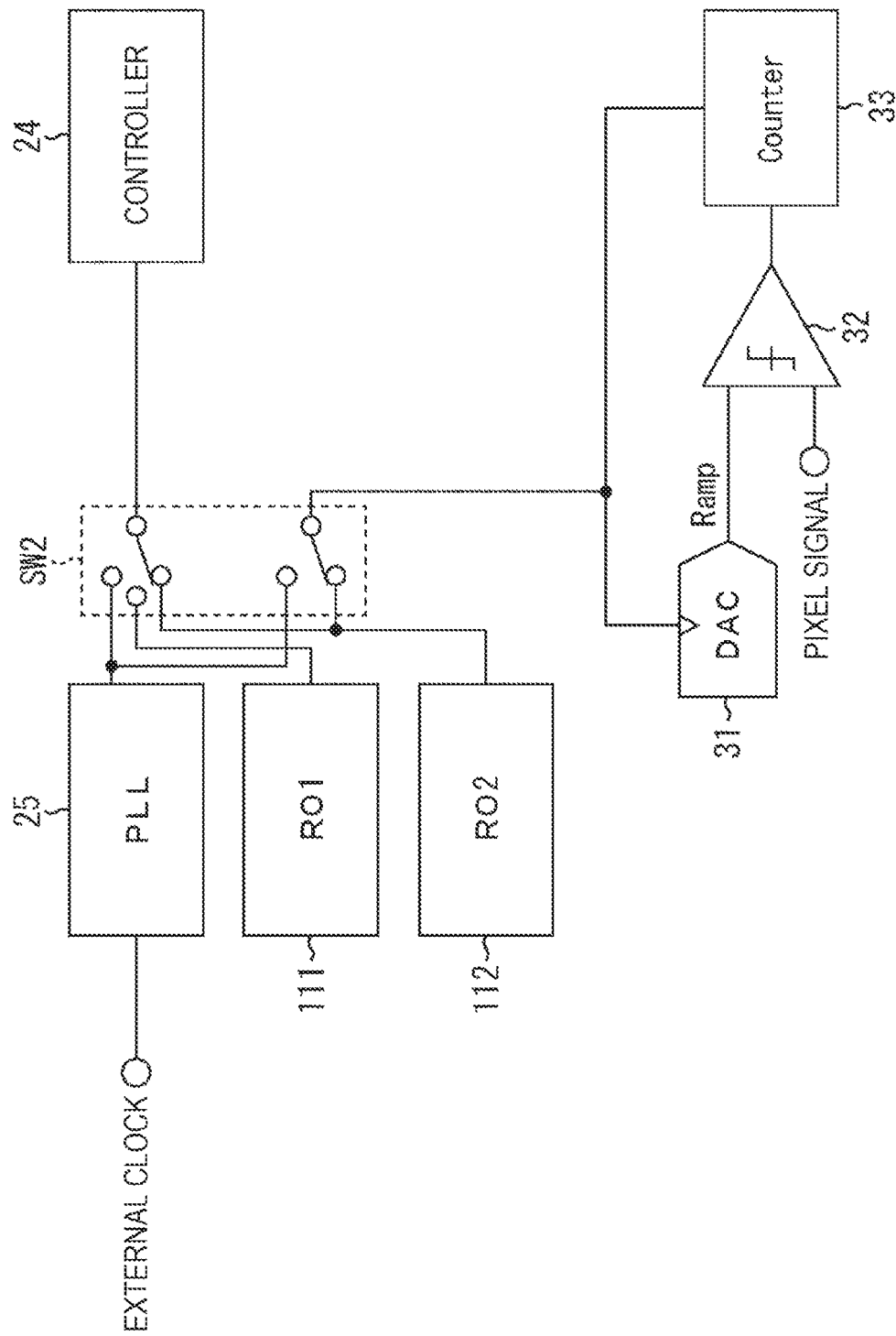
FIG. 12 is a diagram showing a configuration example of the CMOS image sensor during an A/D conversion period.

On the other hand, during the A/D conversion period of the operation period in the sensing mode, as shown in FIG. 12, the second oscillator 112 is connected to each of the controller 24, the DAC 31, the comparator 32 and the counter 33 by the switch SW2, and the entire image sensor 11 operates by the second internal clock of high-speed.

According to the above configuration, during the A/D conversion period of the operation period in the sensing mode, the second oscillator 112 is activated, enabling high-speed operation of the A/D conversion by the second internal clock of high-speed. Moreover, during the period of the operation period other than the A/D conversion period in the sensing mode, the second oscillator 112 is not activated, and the operation of the logic circuit and the frame control can be performed by the first internal clock of low-speed by the first oscillator 111 which is constantly activated.

Therefore, it is possible to eliminate the trade-off relationship between the power consumption of the A/D conversion unit, which operates by the internal clock, and the power consumption of the oscillator, which generates the internal clock, and the power consumption of the entire image sensor that performs self-running operation by the internal clock can be further lowered.

Note that the first oscillator 111 is constantly activated here, but the operation of the first oscillator 111 may be halted during a period in which the second oscillator 112 operates, that is, during the A/D conversion period of the operation period in the sensing mode.

Incidentally, as described above, since the second internal clock of high-speed is used only to enable high-speed operation of the A/D conversion operation, high precision is not required for the frequency thereof. On the other hand, since the first internal clock of low-speed is used to control the charge accumulation time and the like, high precision is required for the frequency thereof. Thereupon, in the first oscillator 111, the frequency of the first internal clock is adjusted according to the application thereof, that is, the precision of the required frequency. Accordingly, the performance of the image sensor 11 can be secured in the sensing mode.

Moreover, since both the first oscillator 111 and the second oscillator 112 have the oscillation circuits that oscillate themselves, there is a possibility that they interfere with each other and the frequency precision deteriorates.

Figure 13:
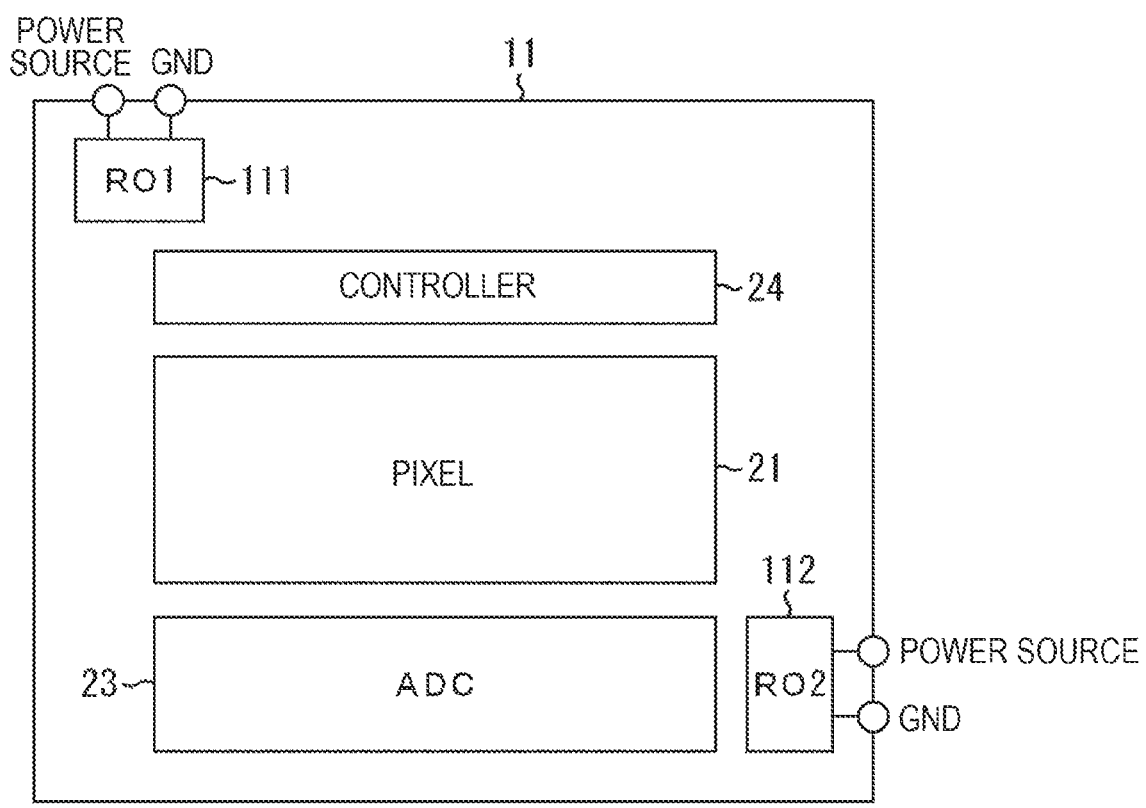
FIG. 13 is a diagram illustrating a layout configuration of the CMOS image sensor.

Thereupon, as shown in FIG. 13, the first oscillator 111 and the second oscillator 112 are arranged at positions spaced apart from each other on a substrate. In particular, since the second internal clock is used only for the A/D conversion operation, the second oscillator 112 that generates the second internal clock is arranged in the vicinity of the ADC 23 that performs the A/D conversion operation in the example in FIG. 13.

Furthermore, in the example in FIG. 13, the power source and GND of the first oscillator 111 and the power source and GND of the second oscillator 112 are electrically separated from each other.

Such layout configuration can prevent the interference between the first oscillator 111 and the second oscillator 112 and the deterioration of the frequency precision.

5. Structure of Image Sensor

Here, the structure that the image sensor of the present disclosure possibly adopts will be described.

The image sensor of the present disclosure is configured as one semiconductor chip in which a logic circuit including a pixel region, a control circuit and a signal processing circuit is mounted on one semiconductor substrate, or can be configured as one semiconductor chip in which a plurality of semiconductor substrates are laminated.

Figure 14:
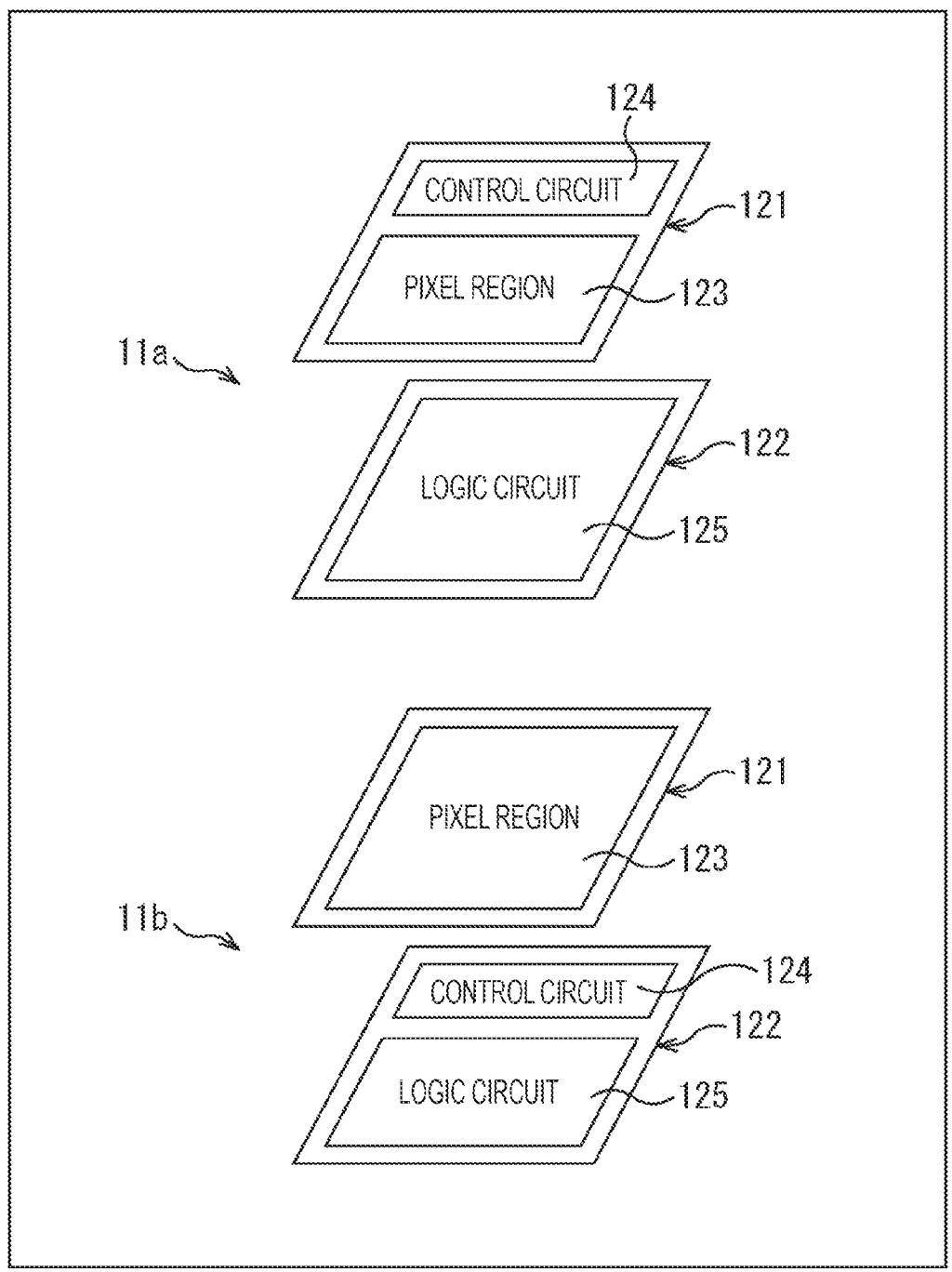
FIG. 14 is a diagram illustrating the structure of the CMOS image sensor according to the present disclosure.

As a first example, an image sensor 11a shown in the upper part of FIG. 14 is constituted by a first semiconductor substrate 121 and a second semiconductor substrate 122. On the first semiconductor substrate 121, a pixel region 123 and a control circuit 124 are mounted. On the second semiconductor substrate 122, a logic circuit 125 including a signal processing circuit is mounted. Then, the first semiconductor substrate 121 and the second semiconductor substrate 122 are electrically connected to each other to constitute the lamination type image sensor 11a as one semiconductor chip.

As a second example, an image sensor 11b shown in the lower part of FIG. 14 is constituted by a first semiconductor substrate 121 and a second semiconductor substrate 122. On the first semiconductor substrate 121, a pixel region 123 is mounted. On the second semiconductor substrate 122, a control circuit 124 and a logic circuit 125 including a signal processing circuit are mounted. Then, the first semiconductor substrate 121 and the second semiconductor substrate 122 are electrically connected to each other to constitute the lamination type image sensor 11b as one semiconductor chip.

Note that the configuration for electrically connecting the first semiconductor substrate 121 and the second semiconductor substrate 122 can be a through via, metal bonding of Cu—Cu, or other configurations.

Moreover, the second semiconductor substrate 122 above is constituted by one layer, but may be constituted by two or more layers. That is, the technology according to the present disclosure can also be applied to an image sensor including a laminate of three or more layers in which the first semiconductor substrate 121 is the uppermost layer.

Note that the technology according to the present disclosure is not limited to the application to an image sensor and can also be applied to an imaging apparatus. Here, the imaging apparatus refers to a camera system such as a digital still camera or a digital video camera, or electronic equipment having an imaging function such as a mobile phone. Note that a module form mounted on electronic equipment, that is, a camera module serves as an imaging apparatus in some cases.

6. Configuration Example of Electronic Equipment

Thereupon, a configuration example of electronic equipment to which the present disclosure is applied will be described with reference to FIG. 15.

Figure 15:
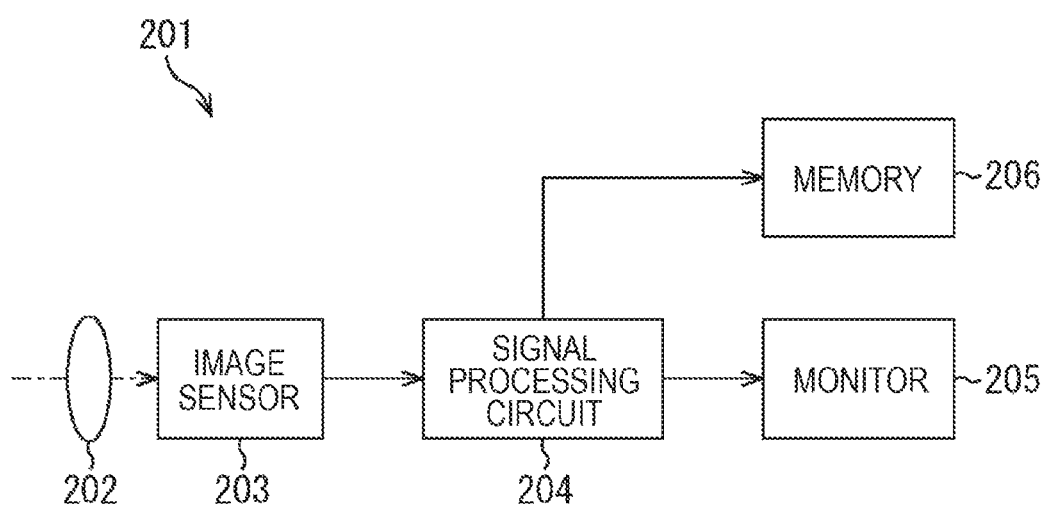
FIG. 15 is a block diagram showing a configuration example of electronic equipment of the present disclosure.

Electronic equipment 200 shown in FIG. 15 includes an optical lens 201, a shutter apparatus 202, an image sensor 203, a driving circuit 204 and a signal processing circuit 205. FIG. 15 shows an embodiment in a case where the aforementioned image sensor 1 of the present disclosure serving as the image sensor 203 is provided in electronic equipment (digital still camera).

The optical lens 201 forms an image of light to be imaged (incident light) from a subject on the imaging surface of the image sensor 203. Accordingly, signal charges are accumulated in the image sensor 203 for a certain period of time. The shutter apparatus 202 controls a light irradiation period and a light blocking period for the image sensor 203.

The driving circuit 204 supplies driving signals to the shutter apparatus 202 and the image sensor 203. The driving signal supplied to the shutter apparatus 202 is a signal for controlling the shutter operation of the shutter apparatus 202. The driving signal supplied to the image sensor 203 is a signal for controlling the signal transfer operation of the image sensor 203. The image sensor 203 performs signal transfer by the driving signal (timing signal) supplied from the driving circuit 204. The signal processing circuit 205 performs various kinds of signal processing on the signal outputted from the image sensor 203. The video signal on which the signal processing is performed is stored in a storage medium such as a memory or outputted to a monitor.

In the electronic equipment 200 according to the present embodiment, the image sensor 203 can realize operation with lower power consumption in the sensing mode. As a result, it is possible to provide electronic equipment with low power consumption.

7. Usage Examples of Image Sensor

Next, usage examples of the image sensor to which the technology according to the present disclosure is applied will be described.

Figure 16:
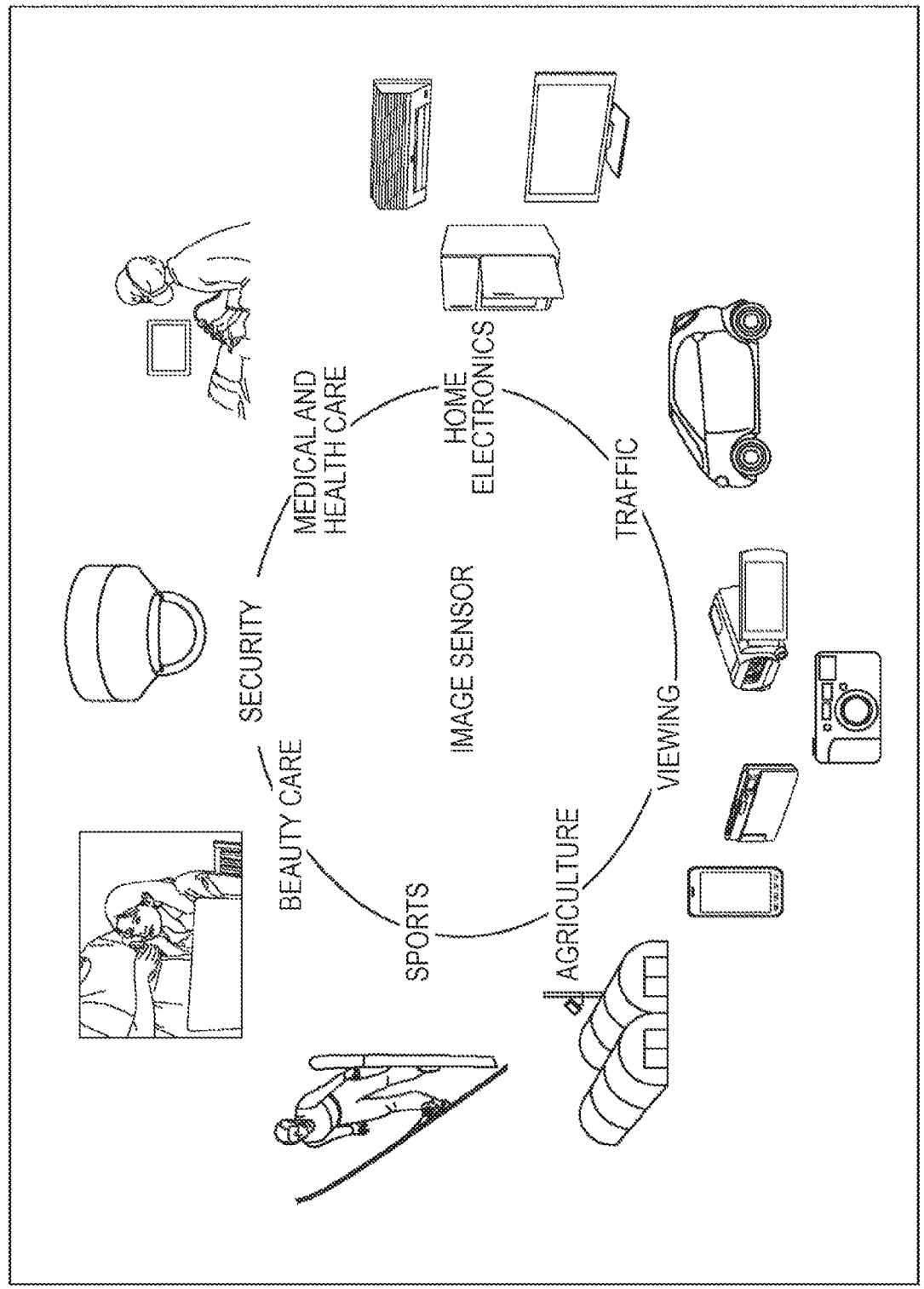
FIG. 16 is a diagram showing usage examples of using the image sensor.

FIG. 16 is a diagram showing usage examples of the aforementioned image sensor.

The aforementioned image sensor can be used in, for example, various cases for sensing light such as visible light, infrared light, ultraviolet light and X-rays as described below.

An apparatus, such as a digital camera or portable equipment with a camera function, which captures an image to be used for viewing.

An apparatus used for traffic, such as an in-vehicle sensor which shoots the front, rear, surroundings, inside, and the like of an automobile for safe driving, such as automatic stop, recognition of driver's condition, and the like, a surveillance camera which monitors traveling vehicles and roads, or a distance measuring sensor which measures the distance between the vehicles, or the like.

An apparatus used for home electronics such as a TV, a refrigerator, or an air conditioner for shooting user's gesture to perform equipment manipulation according to that gesture.

An apparatus used for medical and health care, such as an endoscope or an apparatus for performing angiography by receiving infrared light.

An apparatus used for security, such as a surveillance camera used for crime prevention or a camera for personal authentication application.

An apparatus used for beauty care, such as a skin measuring instrument which shoots skin or a microscope which shoots a scalp.

An apparatus used for sports, such as an action camera or a wearable camera for sports applications or the like.

An apparatus used for agriculture, such as a camera for monitoring the conditions of fields and crops.

8. Application Example 1

The technology according to the present disclosure can be applied to various products. For example, the technology according to the present disclosure may be applied to an endoscopic surgery system.

Figure 17:
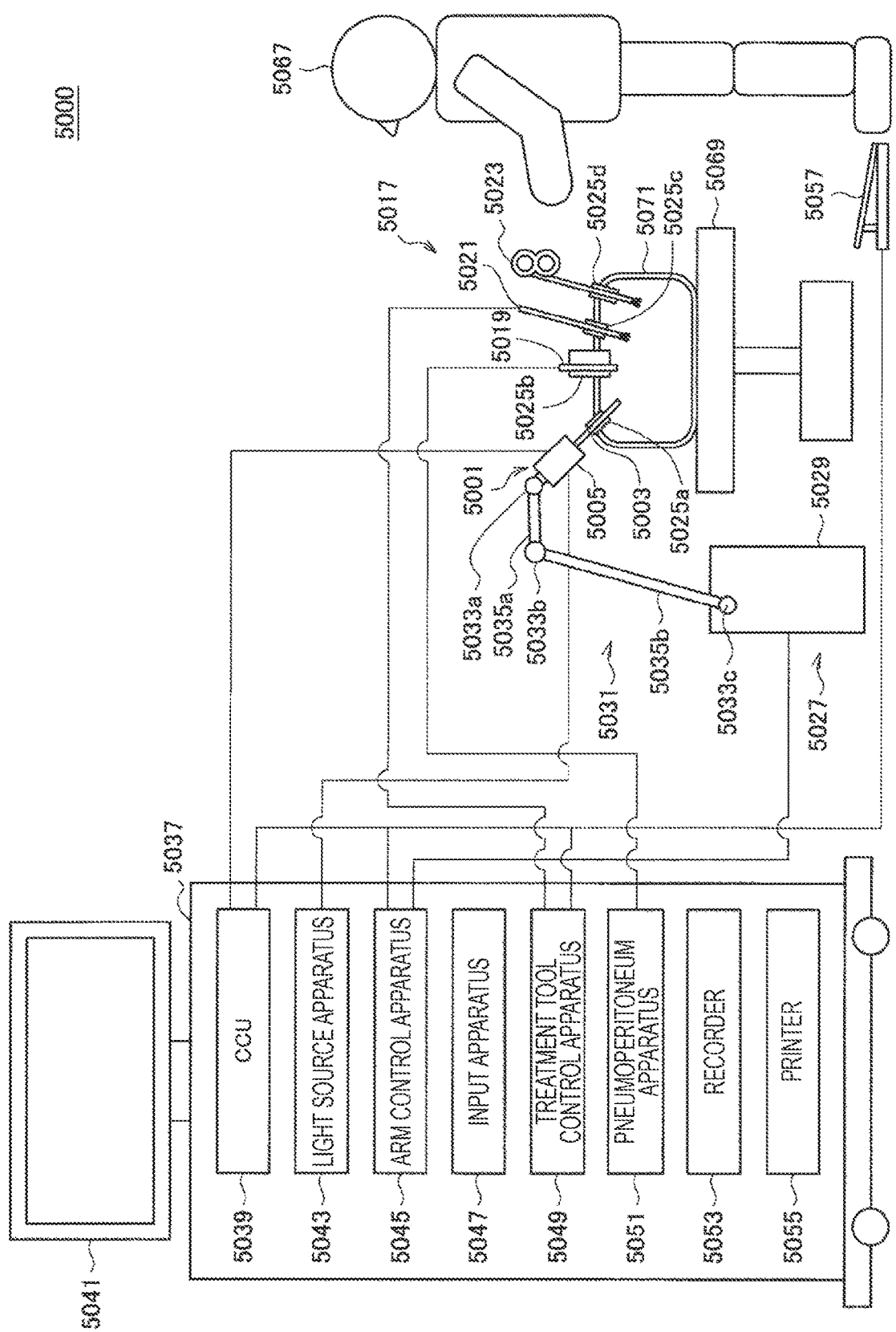
FIG. 17 is a diagram showing one example of the schematic configuration of an endoscopic surgery system.

FIG. 17 is a diagram showing one example of the schematic configuration of an endoscopic surgery system 5000 to which the technology according to the present disclosure may be applied. FIG. 17 shows a situation where a surgeon (doctor) 5067 is conducting surgery on a patient 5071 on a patient bed 5069 by using the endoscopic surgery system 5000. As shown in the drawing, the endoscopic surgery system 5000 is constituted by an endoscope 5001, other surgical tools 5017, a support arm apparatus 5027 that supports the endoscope 5001, and a cart 5037 on which various apparatuses for endoscopic surgery are mounted.

In endoscopic surgery, instead of cutting the abdominal wall and opening the abdomen, the abdominal wall is punctured by a plurality of cylindrical opening tools called trocars 5025a to 5025d. Then, a lens barrel 5003 of the endoscope 5001 and the other surgical tools 5017 are inserted into the body cavity of the patient 5071 from the trocars 5025a to 5025d. In the illustrated example, as the other surgical tools 5017, a pneumoperitoneum tube 5019, an energy treatment tool 5021 and forceps 5023 are inserted into the body cavity of the patient 5071. Moreover, the energy treatment tool 5021 is a treatment tool that performs incision and detachment of tissues, sealing of blood vessels, or the like by high-frequency current or ultrasonic vibration. However, the illustrated surgical tools 5017 are merely examples, and various surgical tools generally used in endoscopic surgery, such as tweezers and a retractor, for example, may be used as the surgical tools 5017.

The image of the surgical site in the body cavity of the patient 5071 captured by the endoscope 5001 is displayed on a display apparatus 5041. The surgeon 5067 performs treatment such as excising the affected part, for example, by using the energy treatment tool 5021 and the forceps 5023 while viewing the image of the surgical site displayed on the display apparatus 5041 in real time. Note that, although not shown, the pneumoperitoneum tube 5019, the energy treatment tool 5021 and the forceps 5023 are supported by the surgeon 5067, an assistant or the like during the surgery.

(Support Arm Apparatus)

The support arm apparatus 5027 includes an arm portion 5031 extending from a base portion 5029. In the illustrated example, the arm portion 5031 is constituted by joint portions 5033a, 5033b and 5033c and links 5035a and 5035b and is driven under the control of an arm control apparatus 5045. The endoscope 5001 is supported by the arm portion 5031, and the position and posture thereof are controlled. Accordingly, fixing the endoscope 5001 at a stable position may be realized.

(Endoscope)

The endoscope 5001 is constituted by the lens barrel 5003 whose region with a predetermined length from the tip is inserted into the body cavity of the patient 5071, and a camera head 5005 connected to the base end of the lens barrel 5003. In the illustrated example, the endoscope 5001 configured as a so-called rigid scope having the rigid lens barrel 5003 is illustrated, but the endoscope 5001 may be configured as a so-called flexible scope having the flexible lens barrel 5003.

At the tip of the lens barrel 5003, an opening portion into which an objective lens is fitted is provided. A light source apparatus 5043 is connected to the endoscope 5001. The light generated by the light source apparatus 5043 is guided to the tip of the lens barrel by a light guide extending inside the lens barrel 5003, and an imaging target in the body cavity of the patient 5071 is irradiated with the light via the objective lens. Note that the endoscope 5001 may be a forward-viewing endoscope or may be a forward-oblique-viewing endoscope or a side-viewing endoscope.

An optical system and an imaging element are provided inside the camera head 5005, and the reflected light (imaging light) from the imaging target is focused on the imaging element by the optical system. The imaging light is photoelectrically converted by the imaging element, and an electric signal corresponding to the imaging light, that is, an image signal corresponding to the imaging image is generated. The image signal is transmitted as RAW data to a camera control unit (CCU) 5039. Note that a function of adjusting the magnification and the focal length by driving the optical system as appropriate is mounted on the camera head 5005.

Note that, for example, for stereoscopic viewing (3D display) or the like, a plurality of imaging elements may be provided in the camera head 5005. In this case, a plurality of relay optical systems are provided inside the lens barrel 5003 in order to guide the imaging light to each of the plurality of imaging elements.

(Various Apparatuses Mounted on Cart)

The CCU 5039 is constituted by a central processing unit (CPU), a graphics processing unit (GPU) and the like and integrally controls the operations of the endoscope 5001 and the display apparatus 5041. Specifically, the CCU 5039 performs various kinds of image processing, such as development processing (demosaic processing) for example, on the image signal received from the camera head 5005 to display an image based on the image signal. The CCU 5039 provides the image signal on which the image processing has been performed to the display apparatus 5041. Moreover, the CCU 5039 transmits a control signal to the camera head 5005 to control the driving thereof. The control signal may include information associated with imaging conditions such as magnification and focal length.

The display apparatus 5041 displays an image based on the image signal, on which the image processing has been performed by the CCU 5039, under the control of the CCU 5039. In a case where the endoscope 5001 is compatible with, for example, high resolution shooting such as 4K (horizontal pixel number 3840×vertical pixel number 2160) or 8K (horizontal pixel number 7680×vertical pixel number 4320) and/or in a case where the endoscope 5001 is compatible with 3D display, it is possible to use one capable of high resolution display and/or one capable of 3D display as the display apparatus 5041 for respective cases. In a case where the endoscope 5001 is compatible with high resolution shooting such as 4K or 8K, a more immersive feeling can be obtained by using one with a size of 55 inches or more as the display apparatus 5041. Moreover, a plurality of display apparatuses 5041 with different resolutions and sizes may be provided depending on the application.

The light source apparatus 5043 is constituted by a light source such as a light emitting diode (LED), for example, and supplies irradiation light for shooting the surgical site to the endoscope 5001.

The arm control apparatus 5045 is constituted by a processor such as a CPU, for example, and operates according to a predetermined program, thereby controlling the driving of the arm portion 5031 of the support arm apparatus 5027 according to a predetermined control method.

An input apparatus 5047 is an input interface for the endoscopic surgery system 5000. A user can input various kinds of information and input instructions into the endoscopic surgery system 5000 via the input apparatus 5047. For example, the user inputs various kinds of information associated with the surgery, such as patient's physical information and information regarding a surgical form of the surgery, via the input apparatus 5047. Furthermore, for example, the user inputs, via the input apparatus 5047, instructions to drive the arm portion 5031, instructions to change the imaging conditions (type of irradiation light, magnification, focal distance and the like) by the endoscope 5001, instructions to drive the energy treatment tool 5021, and the like.

The type of input apparatus 5047 is not limited, and the input apparatus 5047 may be any of various known input apparatuses. For example, a mouse, a keyboard, a touch panel, a switch, a foot switch 5057, a lever and/or the like may be applied as the input apparatus 5047. In a case where a touch panel is used as the input apparatus 5047, the touch panel may be provided on the display face of the display apparatus 5041.

Alternatively, the input apparatus 5047 is a device worn by a user, such as a glasses type wearable device or a head mounted display (HMD) for example, and various kinds of input are performed according to the user's gesture or line of sight detected by these devices. Moreover, the input apparatus 5047 includes a camera that can detect the motion of the user, and various kinds of input are performed according to the user's gesture and line of sight detected from the video imaged by the camera. Furthermore, the input apparatus 5047 includes a microphone that can pick up the voice of the user, and various kinds of input are performed by the sound via the microphone. By thus configuring the input apparatus 5047 to be able to input various kinds of information in a non-contact manner, it is possible for particularly a user who belongs to a clean area (e.g., the surgeon 5067) to manipulate in a non-contact manner the equipment which belongs to an unclean area. Further, since the user can manipulate the equipment without releasing the surgical tools in her/his own hand, the user's convenience is improved.

A treatment tool control apparatus 5049 controls the driving of the energy treatment tool 5021 for cauterizing the tissue, incision, sealing of blood vessels, and the like. In order to inflate the body cavity of the patient 5071 for the purpose of securing the field of view by the endoscope 5001 and of securing the working space of the surgeon, a pneumoperitoneum apparatus 5051 sends gas into the body cavity via the pneumoperitoneum tube 5019. A recorder 5053 is an apparatus capable of recording various kinds of information associated with the surgery. A printer 5055 is an apparatus capable of printing various kinds of information associated with the surgery in various forms, such as text, image or graph.

Hereinafter, the particularly characteristic configuration of the endoscopic surgery system 5000 will be described in more detail.

(Support Arm Apparatus)

The support arm apparatus 5027 includes the base portion 5029, which is a base, and the arm portion 5031 which extends from the base portion 5029. In the illustrated example, the arm portion 5031 is constituted by the plurality of joint portions 5033*a*, 5033*b* and 5033*c* and the plurality of links 5035*a* and 5035*b* linked by the joint portion 5033*b*, but the simplified configuration of the arm portion 5031 is illustrated in FIG. 17 for simplicity. In reality, the shapes, the numbers and the arrangement of the joint portions 5033*a* to 5033*c* and the links 5035*a* and 5035*b* as well as the directions of the rotation axes of the joint portions 5033*a* to 5033*c*, and the like may be set as appropriate so that the arm portion 5031 has a desired degree of freedom. For example, the arm portion 5031 may suitably configured so as to have a degree of freedom greater than or equal to six degrees of freedom. Since the endoscope 5001 can thus be freely moved within the movable range of the arm portion 5031, the lens barrel 5003 of the endoscope 5001 can be inserted into the body cavity of the patient 5071 from a desired direction.

Actuators are provided in the joint portions 5033*a* to 5033*c*, and the joint portions 5033*a* to 5033*c* are configured to be rotatable around predetermined rotation axes by driving the actuators. By controlling the driving of the actuators by the arm control apparatus 5045, the rotation angle of each of the joint portions 5033*a* to 5033*c* is controlled, and the driving of the arm portion 5031 is controlled. Accordingly, the control of the position and posture of the endoscope 5001 may be realized. At this time, the arm control apparatus 5045 can control the driving of the arm portion 5031 by various known control methods such as force control or position control.

For example, the surgeon 5067 performs manipulation input as appropriate via the input apparatus 5047 (including the foot switch 5057), thereby controlling the driving of the arm portion 5031 by the arm control apparatus 5045 according to the manipulation input as appropriate so that the position and posture of the endoscope 5001 may be controlled. With this control, after the endoscope 5001 at the tip of the arm portion 5031 is moved from an arbitrary position to an arbitrary position, the endoscope 5001 can be fixedly supported at the position after the movement. Note that the arm portion 5031 may be manipulated by a so-called master-slave method. In this case, the arm portion 5031 may be remotely manipulated by the user via the input apparatus 5047 installed at a place away from a surgery.

Moreover, in a case where the force control is applied, so-called power assist control may be performed, in which the arm control apparatus 5045 receives an external force from the user, and the actuator of each of the joint portions 5033*a* to 5033*c* is driven so as to smoothly move the arm portion 5031 in accordance with the external force. Accordingly, when the user moves the arm portion 5031 while directly touching the arm portion 5031, the arm portion 5031 can be moved with a relatively light force. Therefore, it is possible to more intuitively move the endoscope 5001 with simpler manipulation, and the user's convenience can be improved.

Here, the endoscope 5001 has been supported generally by a doctor called an endoscopist in endoscopic surgery. On the other hand, by using the support arm apparatus 5027, the position of the endoscope 5001 can be more securely fixed without help of others. Thus, it is possible to stably obtain the image of the surgical site, and surgery can be conducted smoothly.

Note that the arm control apparatus 5045 is not necessarily provided in the cart 5037. Furthermore, the arm control apparatus 5045 is not necessarily one apparatus. For example, the arm control apparatus 5045 may be provided in each of the joint portions 5033*a* to 5033*c* of the arm portion 5031 of the support arm apparatus 5027, and the plurality of arm control apparatuses 5045 may cooperate with each other to realize the driving control of the arm portion 5031.

(Light Source Apparatus)

The light source apparatus 5043 supplies the endoscope 5001 with the irradiation light for shooting the surgical site. The light source apparatus 5043 is constituted by, for example, a white light source constituted by an LED, a laser light source, or a combination thereof. At this time, in a case where the white light source is constituted by the combination of the RGB laser light sources, the output intensity and the output timing of each color (each wavelength) can be controlled with high precision so that the white balance of the imaging image can be adjusted in the light source apparatus 5043. Moreover, in this case, by irradiating the imaging target with the laser light from each of the RGB laser light sources in time division and controlling the driving of the imaging element of the camera head 5005 in synchronization with the irradiation timing, it is also possible to image an image corresponding to each of RGB in time division. According to this method, a color image can be obtained without providing a color filter in the imaging element.

Furthermore, the driving of the light source apparatus 5043 may be controlled so as to change the output light intensity at each predetermined time. By controlling the driving of the imaging element of the camera head 5005 in synchronization with the timing of the change of the light intensity to acquire images in time division and synthesizing the images, an image of highly dynamic range can be obtained without so-called black defects or halation.

Further, the light source apparatus 5043 may be configured so as to be able to supply light of a predetermined wavelength band for special light imaging. In the special light imaging, for example, so-called narrow band imaging is performed, in which irradiation with light of a band narrower than that of the irradiation light (i.e., white light) at the time of normal imaging is performed by utilizing the wavelength dependence of light absorption in body tissue to shoot a predetermined tissue, such as blood vessels of a mucous membrane surface layer, with high contrast. Alternatively, in the special light imaging, fluorescence imaging may be performed, in which an image is obtained by fluorescence generated by irradiation with excitation light. In the fluorescence imaging, one that irradiates body tissue with excitation light and images fluorescence from the body tissue (autofluorescence imaging), or one that locally injects a reagent, such as indocyanine green (ICG), into body tissue and irradiates the body tissue with excitation light corresponding to the fluorescence wavelength of that reagent to obtain a fluorescent image, or the like may be performed. The light source apparatus 5043 may be configured to be able to supply narrow band light and/or excitation light for such special light imaging.

(Camera Head and CCU)

Figure 18:
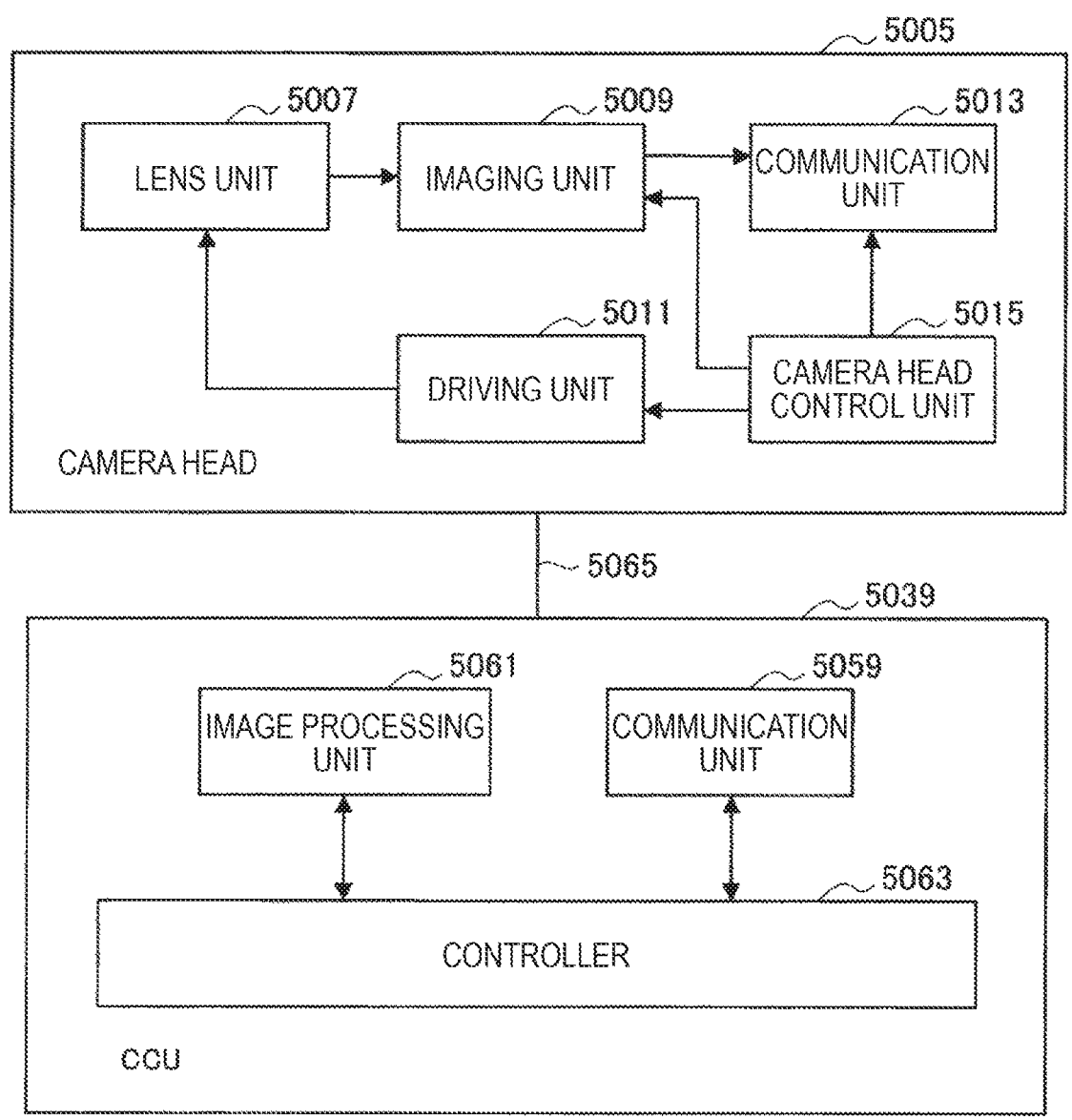
FIG. 18 is a block diagram showing one example of the functional configurations of the camera head and the CCU shown in FIG. 17.

The functions of the camera head 5005 of the endoscope 5001 and the CCU 5039 will be described in more detail with reference to FIG. 18. FIG. 18 is a block diagram showing one example of the functional configurations of the camera head 5005 and the CCU 5039 shown in FIG. 17.

Referring to FIG. 18, the camera head 5005 has a lens unit 5007, an imaging unit 5009, a driving unit 5011, a communication unit 5013 and a camera head control unit 5015 as the functions thereof. Meanwhile, the CCU 5039 has a communication unit 5059, an image processing unit 5061 and a controller 5063 as the functions thereof. The camera head 5005 and the CCU 5039 are connected by a transmission cable 5065 so as to be able to communicate bidirectionally.

First, the functional configuration of the camera head 5005 will be described. The lens unit 5007 is an optical system provided at a connection portion with the lens barrel 5003. The imaging light taken in from the tip of the lens barrel 5003 is guided to the camera head 5005 and is incident on the lens unit 5007. The lens unit 5007 is constituted by combining a plurality of lenses including a zoom lens and a focus lens. The optical characteristics of the lens unit 5007 are adjusted so as to collect the imaging light on the light receiving face of the imaging element of the imaging unit 5009. Moreover, the zoom lens and the focus lens are configured so that their positions on the optical axis can be moved in order to adjust the magnification and focus of an imaging image.

The imaging unit 5009 is constituted by an imaging element and arranged subsequently to the lens unit 5007. The imaging light having passed through the lens unit 5007 is collected on the light receiving face of the imaging element, and an image signal corresponding to the imaging image is generated by photoelectric conversion. The image signal generated by the imaging unit 5009 is provided to the communication unit 5013.

As the imaging element constituting the imaging unit 5009, for example, a complementary metal oxide semiconductor (CMOS) type image sensor is used, which has a Bayer array and is capable of color imaging. Note that, as the imaging element, for example, one capable of coping with capturing an image with high resolution of 4K or more may be used. By obtaining the image of the surgical site with high resolution, the surgeon 5067 can grasp the state of the surgical site in more detail, and the surgery can be progressed more smoothly.

Moreover, the imaging element constituting the imaging unit 5009 is configured to be paired for acquiring image signals for the right and left eyes, respectively, the image signal being compatible with 3D display. By performing the 3D display, the surgeon 5067 can grasp the depth of the body tissue at the surgical site more accurately. Note that, in a case where the imaging unit 5009 is constituted by a multi-plate type, a plurality of lens units 5007 are provided for each imaging element.

Furthermore, the imaging unit 5009 is not necessarily provided in the camera head 5005. For example, the imaging unit 5009 may be provided inside the lens barrel 5003 just behind the objective lens.

The driving unit 5011 is constituted by an actuator and moves the zoom lens and the focus lens of the lens unit 5007 by only a predetermined distance along the optical axis under the control of the camera head control unit 5015. Accordingly, the magnification and the focus of the imaging image by the imaging unit 5009 can be adjusted as appropriate.

The communication unit 5013 is constituted by a communication apparatus for transmitting and receiving various kinds of information to and from the CCU 5039. The communication unit 5013 transmits the image signal obtained from the imaging unit 5009 as RAW data to the CCU 5039 via the transmission cable 5065. At this time, in order to display the imaging image of the surgical site with low latency, it is preferable that the image signal be transmitted by optical communication. It is because the moving image of the surgical site is demanded to be displayed in real time as much as possible for safer and more secure surgery since the surgeon 5067 conducts surgery while viewing the state of the affected part by the imaging image during surgery. In a case where optical communication is performed, a photoelectric conversion module that converts an electric signal into an optical signal is provided in the communication unit 5013. The image signal is converted into an optical signal by the photoelectric conversion module, and then transmitted to the CCU 5039 via the transmission cable 5065.

Moreover, the communication unit 5013 receives, from the CCU 5039, a control signal for controlling the driving of the camera head 5005. For example, the control signal includes information associated with imaging conditions, such as information indicating designation of a frame rate of an imaging image, information indicating designation of an exposure value at the time of imaging, and/or information indicating designation of the magnification and focus of the imaging image. The communication unit 5013 provides the received control signal to the camera head control unit 5015. Note that a control signal from the CCU 5039 may also be transmitted by optical communication. In this case, the communication unit 5013 is provided with a photoelectric conversion module that converts an optical signal into an electric signal. The control signal is converted into an electric signal by the photoelectric conversion module and is then provided to the camera head control unit 5015.

Note that the imaging conditions, such as the above frame rate, exposure value, magnification and focus, are automatically set by the controller 5063 of the CCU 5039 on the basis of the acquired image signal. That is, a so-called auto exposure (AE) function, auto focus (AF) function and auto white balance (AWB) function are mounted on the endoscope 5001.

The camera head control unit 5015 controls the driving of the camera head 5005 on the basis of the control signal that is received from the CCU 5039 via the communication unit 5013. For example, the camera head control unit 5015 controls the driving of the imaging element of the imaging unit 5009 on the basis of the information indicating the designation of the frame rate of the imaging image and/or the information indicating the designation of the exposure at the time of imaging. Furthermore, for example, the camera head control unit 5015 moves the zoom lens and the focus lens of the lens unit 5007 via the driving unit 5011 as appropriate on the basis of the information indicating the designation of the magnification and focus of the imaging image. The camera head control unit 5015 may further include a function of storing information for identifying the lens barrel 5003 and the camera head 5005.

Note that the camera head 5005 can be caused to have resistance to autoclave sterilization processing by arranging the constituents such as the lens unit 5007 and the imaging unit 5009 in a hermetically sealed structure with high airtightness and waterproofness.

Next, the functional configuration of the CCU 5039 will be described. The communication unit 5059 is constituted by a communication apparatus for transmitting and receiving various kinds of information to and from the camera head 5005. The communication unit 5059 receives an image signal transmitted from the camera head 5005 via the transmission cable 5065. At this time, the image signal may be suitably transmitted by optical communication as previously mentioned. In this case, for the optical communication, the communication unit 5059 is provided with a photoelectric conversion module that converts an optical signal into an electric signal. The communication unit 5059 provides the image signal that is converted into the electric signal to the image processing unit 5061.

Moreover, the communication unit 5059 transmits, to the camera head 5005, a control signal for controlling the driving of the camera head 5005. The control signal may also be transmitted by optical communication.

The image processing unit 5061 performs various kinds of image processing on the image signal which is RAW data transmitted from the camera head 5005. For example, the image processing includes various kinds of known signal processing, such as development processing, high-quality image processing (band enhancement processing, super-resolution processing, noise reduction (NR) processing and/or camera-shake correction processing or the like), and/or enlargement processing (electronic zoom processing). Furthermore, the image processing unit 5061 performs wave-detection processing on the image signal for performing AE, AF and AWB.

The image processing unit 5061 is constituted by processors such as a CPU, and a GPU, and the processors operates according to a predetermined program so that the image processing and wave-detection processing described above may be performed. Note that, in a case where the image processing unit 5061 is constituted by a plurality of GPUs, the image processing unit 5061 divides the information regarding the image signals as appropriate and performs image processing in parallel by the plurality of GPUs.

The controller 5063 performs various kinds of control related to imaging of the surgical site by the endoscope 5001 and display of that imaging image. For example, the controller 5063 generates a control signal for controlling the driving of the camera head 5005. At this time, in a case where the imaging condition is inputted by the user, the controller 5063 generates the control signal on the basis of the input by the user. Alternatively, in a case where the AE function, the AF function and the AWB function are mounted on the endoscope 5001, the controller 5063 calculates the optimum exposure value, focal length and white balance as appropriate according to the result of the wave-detection processing by the image processing unit 5061 and generates the control signal.

Moreover, the controller 5063 causes the display apparatus 5041 to display the image of the surgical site on the basis of the image signal on which the image processing is performed by the image processing unit 5061. At this time, the controller 5063 recognizes various objects in the surgical site image by using various image recognition technologies. For example, the controller 5063 can recognize surgical tools such as forceps, a specific body part, bleeding, a mist when using the energy treatment tool 5021, and the like by detecting the shape of the edge, color and the like of the object included in the surgical site image. When causing the display apparatus 5041 to display the surgical site image, the controller 5063 superimposes and displays various kinds of surgery assist information on the surgical site image by using the recognition results thereof. The surgery assist information is superimposed, displayed and presented to the surgeon 5067, thereby making it possible to proceed the surgery more safely and more securely.

The transmission cable 5065 connecting the camera head 5005 and the CCU 5039 is an electric signal cable compatible with electric signal communication, an optical fiber compatible with optical communication, or a composite cable thereof.

Here, in the illustrated example, wire communication is performed by using the transmission cable 5065, but wireless communication may be performed between the camera head 5005 and the CCU 5039. In a case where the wireless communication is performed between both, it is unnecessary to lay the transmission cable 5065 in a surgery so that the circumstance where the movement of the medical staff in the surgery is hindered by the transmission cable 5065 may be solved.

One example of the endoscopic surgery system 5000 to which the technology according to the present disclosure may be applied has been described above. Note that the endoscopic surgery system 5000 has been described as one example here, but the system to which the technology according to the present disclosure may be applied is not limited to this example. For example, the technology according to the present disclosure may be applied to a flexible endoscopic system for test or a microscopic surgery system.

The technology according to the present disclosure may be suitably applied to the imaging element constituting the imaging unit 5009 among the constituents described above. By applying the technology according to the present disclosure to the imaging element constituting the imaging unit 5009, an endoscopic surgery system with low power consumption can be realized.

9. Application Example 2

In addition, the technology according to the present disclosure may be realized as an apparatus mounted on any one of various mobile bodies, such as an automobile, an electric automobile, a hybrid electric automobile, a motorcycle, a bicycle, a personal mobility, an airplane, a drone, a ship, a robot, a construction machine and an agricultural machine (tractor).

Figure 19:
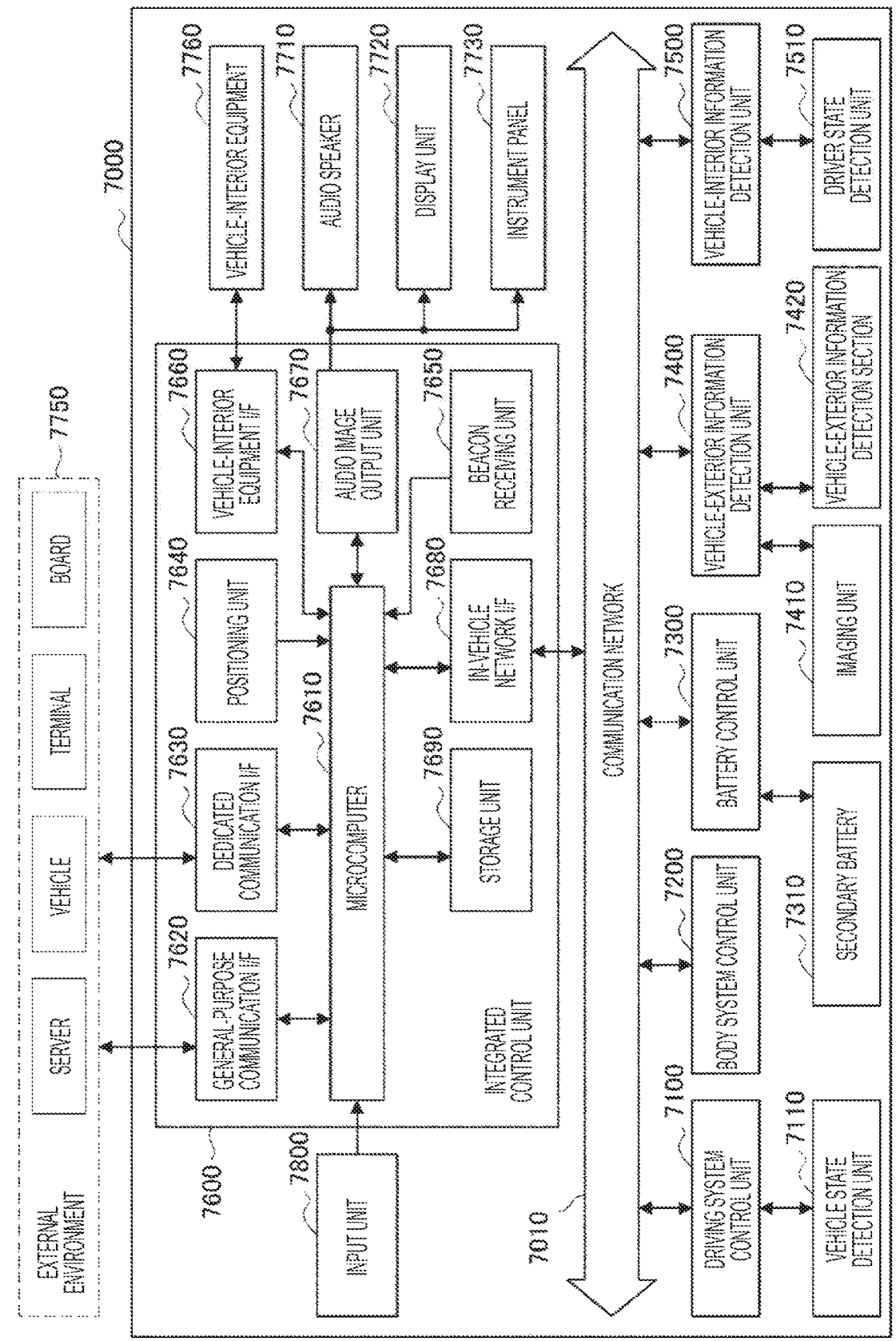
FIG. 19 is a block diagram showing one example of the schematic configuration of a vehicle control system.

FIG. 19 is a block diagram showing a schematic configuration example of a vehicle control system 7000 which is one example of a mobile body control system to which the technology according to the present disclosure may be applied. The vehicle control system 7000 includes a plurality of electronic control units connected via a communication network 7010. In the example shown in FIG. 19, the vehicle control system 7000 includes a driving system control unit 7100, a body system control unit 7200, a battery control unit 7300, a vehicle-exterior information detection unit 7400, a vehicle-interior information detection unit 7500 and an integrated control unit 7600. For example, the communication network 7010 connecting the plurality of these control units may be an in-vehicle communication network conforming to any standards, such as a controller area network (CAN), a local interconnect network (LIN), a local area network (LAN) or FlexRay (registered trademark).

Each of the control units includes a microcomputer that performs arithmetic processing according to various programs, a storage unit that stores programs executed by the microcomputer, parameters used for various arithmetic operations, and the like, and a driving circuit that drives various apparatuses to be controlled. Each of the control units includes a network I/F for communicating with other control units via the communication network 7010 as well as includes a communication I/F for communicating with apparatuses, sensors, or the like inside and outside the vehicle by wire communication or wireless communication. In FIG. 19, a microcomputer 7610, a general-purpose communication I/F 7620, a dedicated communication I/F 7630, a positioning unit 7640, a beacon receiving unit 7650, vehicle-interior equipment I/F 7660, an audio image output unit 7670, an in-vehicle network I/F 7680 and a storage unit 7690 are shown as the functional constituents of the integrated control unit 7600. Similarly, each of other control units also includes a microcomputer, a communication I/F, a storage unit and the like.

The driving system control unit 7100 controls, according to various programs, the operation of the apparatuses related to the driving system of the vehicle. For example, the driving system control unit 7100 functions as a control apparatus for a driving force generation apparatus for generating a driving force of a vehicle, such as an internal combustion engine or a driving motor, a driving force transmission mechanism for transmitting a driving force to a wheel, a steering mechanism that adjusts rudder angle of a vehicle, a brake apparatus that generates a braking force of the vehicle, and the like. The driving system control unit 7100 may have a function as a control apparatus such as an antilock brake system (ABS) or an electronic stability control (ESC).

A vehicle state detection unit 7110 is connected to the driving system control unit 7100. For example, the vehicle state detection unit 7110 includes at least one of a gyro sensor that detects the angular velocity of the axial rotational motion of the vehicle body, an acceleration sensor that detects the acceleration of the vehicle, or a sensor for detecting a manipulation amount of an accelerator pedal, a manipulation amount of a brake pedal, a steering angle of a steering wheel, an engine speed, a rotational speed of a wheel or the like. The driving system control unit 7100 performs arithmetic processing by using a signal inputted from the vehicle state detection unit 7110 and controls the internal combustion engine, the driving motor, the electric power steering apparatus, a brake apparatus, or the like.

The body system control unit 7200 controls, according to various programs, the operation of various apparatuses equipped on the vehicle body. For example, the body system control unit 7200 functions as a control apparatus for a keyless entry system, a smart key system, a power window apparatus or various lamps such as a head lamp, a back lamp, a brake lamp, an indicator or a fog lamp. In this case, radio waves dispatched from a mobile device that substitutes a key or signals of various switches may be inputted into the body system control unit 7200. The body system control unit 7200 accepts the input of these radio waves or signals and controls a door lock apparatus, a power window apparatus, lamps and the like of the vehicle.

The battery control unit 7300 controls, according to various programs, a secondary battery 7310 which is a power supply source of the driving motor. For example, information such as a battery temperature, a battery output voltage or the remaining capacity of the battery is inputted into the battery control unit 7300 from a battery apparatus including the secondary battery 7310. The battery control unit 7300 performs arithmetic processing by using these signals and controls the temperature adjustment control of the secondary battery 7310, a cooling apparatus provided in the battery apparatus or the like.

The vehicle-exterior information detection unit 7400 detects information outside the vehicle on which the vehicle control system 7000 is mounted. For example, at least one of an imaging unit 7410 or a vehicle-exterior information detection section 7420 is connected to the vehicle-exterior information detection unit 7400. The imaging unit 7410 includes at least one of a time-of-flight (ToF) camera, a stereo camera, a monocular camera, an infrared camera or another camera. The vehicle-exterior information detection section 7420 includes, for example, at least one of an environment sensor for detecting the current weather or atmospheric phenomena, or surrounding information detection sensor for detecting another vehicle, an obstacle, a pedestrian or the like surrounding the vehicle on which the vehicle control system 7000 is mounted.

The environment sensor may be, for example, at least one of a raindrop sensor that detects rainy weather, a fog sensor that detects fog, a sunshine sensor that detects a sunshine degree, or a snow sensor that detects snowfall. The surrounding information detection sensor may be at least one of an ultrasonic sensor, a radar apparatus or a light detection and ranging or laser imaging detection and ranging (LIDAR) apparatus. The imaging unit 7410 and the vehicle-exterior information detection section 7420 may be each provided as independent sensors or apparatuses or may be provided as an apparatus in which a plurality of sensors or apparatuses are integrated.

Figure 20:
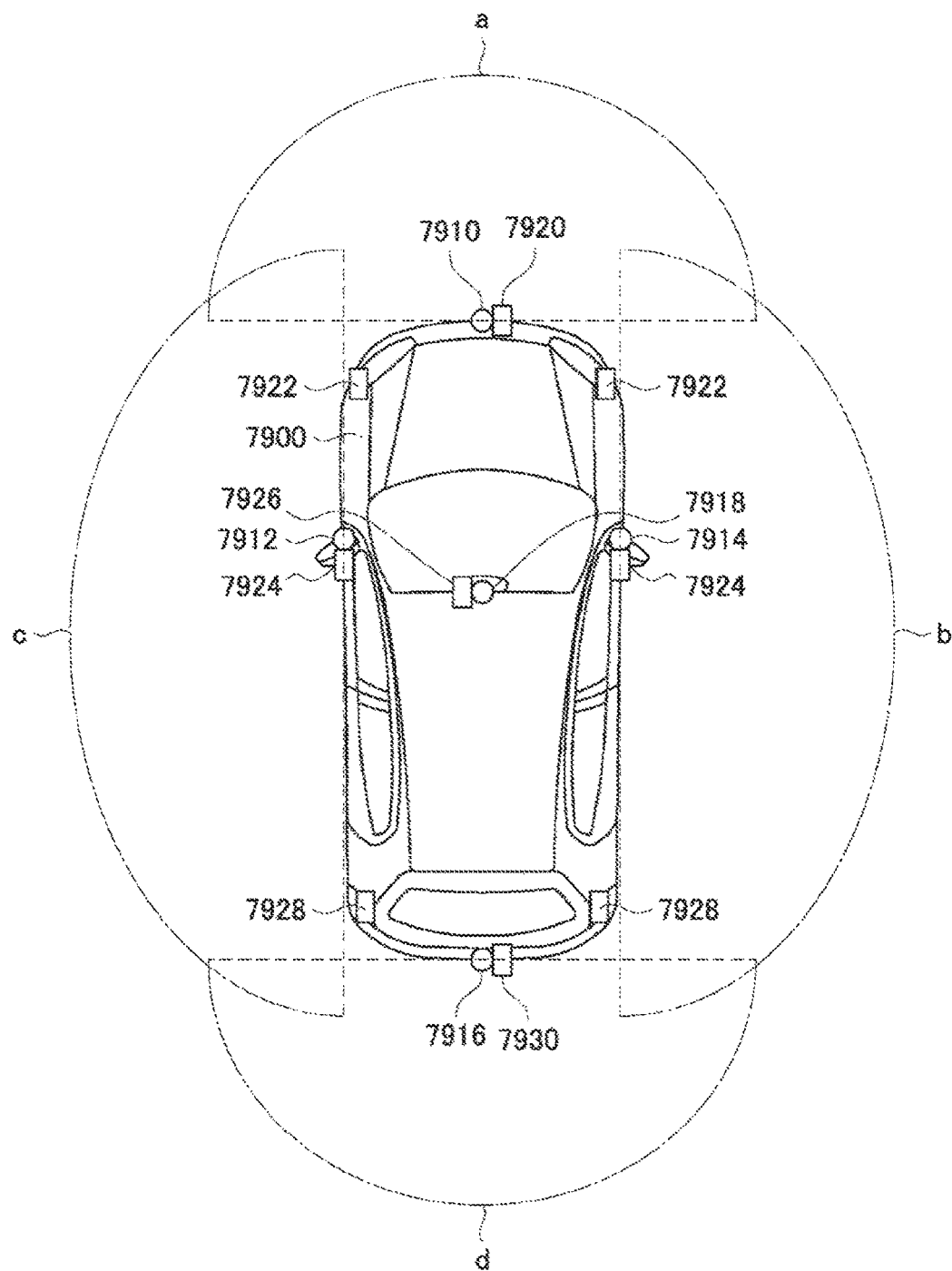
FIG. 20 is an explanatory diagram showing one example of installation positions of the vehicle-exterior information detection section and the imaging unit.

Here, FIG. 20 shows an example of installation positions of the imaging unit 7410 and the vehicle-exterior information detection section 7420. For example, imaging units 7910, 7912, 7914, 7916 and 7918 are provided at at least one position of a front nose, side mirrors, a rear bumper or a back door or an upper portion of a windshield of the vehicle compartment of a vehicle 7900. The imaging unit 7910 provided at the front nose and the imaging unit 7918 provided at the upper portion of the windshield in the vehicle compartment mainly acquire images ahead of the vehicle 7900. The imaging units 7912 and 7914 provided at the side mirrors mainly acquire images of the sides of the vehicle 7900. The imaging unit 7916 provided at the rear bumper or the back door mainly acquires an image behind the vehicle 7900. The imaging unit 7918 provided at the upper portion of the windshield in the vehicle compartment is mainly used to detect a preceding vehicle, a pedestrian, an obstacle, a traffic signal, a traffic sign, a traffic lane, or the like.

Note that FIG. 20 shows one example of shooting ranges of the respective imaging units 7910, 7912, 7914 and 7916. An imaging range a indicates the imaging range of the imaging unit 7910 provided at the front nose, imaging ranges b and c indicate the respective imaging ranges of the imaging units 7912 and 7914 provided at the side mirrors, and an imaging range d indicates the imaging range of the imaging unit 7916 provided at the rear bumper or the back door. For example, by superposing the image data imaged by the imaging units 7910, 7912, 7914 and 7916, an overhead image of the vehicle 7900 viewed from the top is obtained.

The vehicle-exterior information detection sections 7920, 7922, 7924, 7926, 7928 and 7930 provided at the front, rear, sides, corners and the upper portion of the windshield in the vehicle compartment of the vehicle 7900 may be, for example, ultrasonic sensors or radar apparatuses. The vehicle-exterior information detection sections 7920, 7926 and 7930 provided at the front nose, the rear bumper or the back door, and the upper portion of the windshield in the vehicle compartment of the vehicle 7900 may be, for example, LIDAR apparatuses. These vehicle-exterior information detection sections 7920 to 7930 are mainly used to detect a preceding vehicle, a pedestrian, an obstacle, or the like.

Returning to FIG. 19, the description will be continued. The vehicle-exterior information detection unit 7400 causes the imaging unit 7410 to image an image of the outside of the vehicle and receives the imaged image data. The vehicle-exterior information detection unit 7400 also receives detection information from the connected vehicle-exterior information detection section 7420. In a case where the vehicle-exterior information detection section 7420 is an ultrasonic sensor, a radar apparatus or an LIDAR apparatus, the vehicle-exterior information detection unit 7400 causes the vehicle-exterior information detection section 7420 to dispatch ultrasonic waves, electromagnetic waves, or the like and receives information regarding the received reflected waves. The vehicle-exterior information detection unit 7400 may perform object detection processing or distance detection processing on a person, a car, an obstacle, a sign, a character on a road surface, or the like, on the basis of the information received. The vehicle-exterior information detection unit 7400 may perform environment recognition processing for recognizing rainfall, fog, road surface condition, or the like on the basis of the information received. The vehicle-exterior information detection unit 7400 may calculate the distance to the object outside the vehicle on the basis of the information received.

The vehicle-exterior information detection unit 7400 may also perform image recognition processing or distance detection processing for recognizing a person, a car, an obstacle, a sign, a character on a road surface, or the like, on the basis of the image data received. The vehicle-exterior information detection unit 7400 may perform processing such as distortion correction or alignment on the image data received as well as synthesize the image data imaged by different imaging units 7410 to generate an overhead image or a panorama image. The vehicle-exterior information detection unit 7400 may perform viewpoint conversion processing by using image data imaged by different imaging units 7410.

The vehicle-interior information detection unit 7500 detects information inside the vehicle. To the vehicle-interior information detection unit 7500, for example, a driver state detection unit 7510 that detects the state of the driver is connected. The driver state detection unit 7510 may include a camera that images the driver, a biological sensor that detects biological information of the driver, a microphone that collects sound in the vehicle compartment, or the like. For example, the biological sensor is provided at a seating face, a steering wheel or the like and detects biological information of an occupant sitting on a seat or a driver holding a steering wheel. The vehicle-interior information detection unit 7500 may, on the basis of the detection information inputted from the driver state detection unit 7510, calculate the degree of fatigue or the degree of concentration of the driver or determine whether or not the driver is dozing off. The vehicle-interior information detection unit 7500 may perform processing such as noise canceling processing on the sound signal collected.

The integrated control unit 7600 controls the overall operation in the vehicle control system 7000 according to various programs. An input unit 7800 is connected to the integrated control unit 7600. For example, the input unit 7800 is realized by an apparatus which may be manipulated by the occupant for input, such as a touch panel, a button, a microphone, a switch or a lever. Data obtained by recognizing sound inputted by the microphone may be inputted into the integrated control unit 7600. For example, the input unit 7800 may be a remote control apparatus utilizing infrared rays or other radio waves or may be external connection equipment such as a mobile phone or a personal digital assistant (PDA) compatible with the manipulation of the vehicle control system 7000. The input unit 7800 may be, for example, a camera, in which case the occupant can input information by gesture. Alternatively, data obtained by detecting the motion of the wearable device worn by the occupant may be inputted. Moreover, the input unit 7800 may include, for example, an input control circuit or the like that generates an input signal on the basis of the information inputted by the occupant or the like by using the above input unit 7800 and outputs the input signal to the integrated control unit 7600. The occupant or the like manipulates this input unit 7800 to input various kinds of data into the vehicle control system 7000 or instruct the vehicle control system 7000 to perform processing operation.

The storage unit 7690 may include a read only memory (ROM) that stores various programs executed by the microcomputer, and a random access memory (RAM) that stores various parameters, arithmetic operation results, sensor values, or the like. Furthermore, the storage unit 7690 may be realized by a magnetic storage device such as a hard disc drive (HDD), a semiconductor storage device, an optical storage device, a magneto-optical storage device, or the like.

The general-purpose communication I/F 7620 is a general-purpose communication I/F that mediates communication with various kinds of equipment existing in an external environment 7750. A cellular communication protocol such as a global system of mobile communications (GSM), WiMAX, long term evolution (LTE) or LTE-advanced (LTE-A), or another wireless communication protocol such as wireless LAN (may also be called Wi-Fi (registered trademark)) or Bluetooth (registered trademark) may be implemented in the general-purpose communication I/F 7620. For example, the general-purpose communication I/F 7620 may be connected to equipment (e.g., an application server or a control server) existing on an external network (e.g., the Internet, a cloud network or a business specific network) via a base station or an access point. Furthermore, for example, the general-purpose communication I/F 7620 may be connected to a terminal (e.g., a terminal of a driver, pedestrian or store or a machine type communication (MTC) terminal) existing in the vicinity of the vehicle by using a peer-to-peer (P2P) technology.

The dedicated communication I/F 7630 is a communication I/F that supports a communication protocol formulated for the purpose of use in vehicle. For example, a standard protocol such as wireless access in vehicle environment (WAVE), which is a combination of lower layer IEEE 802.11p and upper layer IEEE 1609, dedicated short range communications (DSRM) or a cellular communication protocol may be implemented in the dedicated communication I/F 7630. Typically, the dedicated communication I/F 7630 prosecutes V2X communication which is a concept including one or more of vehicle-to-vehicle communication, vehicle-to-infrastructure communication, vehicle-to-home communication or vehicle-to-pedestrian communication.

For example, the positioning unit 7640 receives a global navigation satellite system (GNSS) signal from a GNSS satellite (e.g., a global positioning system (GPS) signal from a GPS satellite), executes positioning, and generates position information including latitude, longitude and altitude of the vehicle. Note that the positioning unit 7640 may identify the current position by exchanging signals with a wireless access point or may acquire the position information from a terminal such as a mobile phone, a PHS or a smartphone having a positioning function.

For example, the beacon receiving unit 7650 receives radio waves or electromagnetic waves dispatched from a radio station or the like installed on a road and acquires information such as the current position, congestion, road closure or required time. Note that the function of the beacon receiving unit 7650 may be included in the dedicated communication I/F 7630 previously mentioned.

The vehicle-interior equipment I/F 7660 is a communication interface that mediates the connections between the microcomputer 7610 and various kinds of vehicle-interior equipment 7760 existing in the vehicle. The vehicle-interior equipment I/F 7660 may establish wireless connection by using a wireless communication protocol such as wireless LAN, Bluetooth (registered trademark), near field communication (NFC) or wireless USB (WUSB). Moreover, the vehicle-interior equipment I/F 7660 may establish wired connection with a universal serial bus (USB), a high-definition multimedia interface (HDMI), a mobile high-definition link (MHL) or the like via a connection terminal (not shown) (and a cable if necessary). The vehicle-interior equipment 7760 may include, for example, at least one of mobile equipment or a wearable equipment possessed by the occupant, or information equipment carried in or attached to the vehicle. Furthermore, the vehicle-interior equipment 7760 may include a navigation apparatus that performs a route search to an arbitrary destination. The vehicle-interior equipment I/F 7660 exchanges control signals or data signals with these pieces of vehicle-interior equipment 7760.

The in-vehicle network I/F 7680 is an interface that mediates communication between the microcomputer 7610 and the communication network 7010. The in-vehicle network I/F 7680 transmits and receives signals and the like according to a predetermined protocol supported by the communication network 7010.

The microcomputer 7610 of the integrated control unit 7600 controls the vehicle control system 7000 according to various programs on the basis of the information acquired via at least one of the general-purpose communication I/F 7620, the dedicated communication I/F 7630, the positioning unit 7640, the beacon receiving unit 7650, the vehicle-interior equipment I/F 7660 or the in-vehicle network I/F 7680. For example, the microcomputer 7610 may perform arithmetic processing to obtain a control target value of the driving force generation apparatus, the steering mechanism or the brake apparatus on the basis of the acquired vehicle-interior and vehicle-exterior information and output a control instruction to the driving system control unit 7100. For example, the microcomputer 7610 may perform cooperative control for the purpose of realizing the function of an advanced driver assistance system (ADAS) including collision avoidance or impact reduction of the vehicle, follow-up traveling based on the inter-vehicle distance, vehicle speed maintenance traveling, vehicle collision warning, vehicle lane departure warning, and the like. The microcomputer 7610 may also perform cooperative control for the purpose of automatic driving which autonomously travels without depending on the manipulation of the driver or the like by controlling the driving force generation apparatus, the steering mechanism, the brake apparatus, or the like on the basis of the acquired vehicle surrounding information.

On the basis of the information acquired via at least one of the general-purpose communication I/F 7620, the dedicated communication I/F 7630, the positioning unit 7640, the beacon receiving unit 7650, the vehicle-interior equipment I/F 7660 or the in-vehicle network I/F 7680, the microcomputer 7610 may generate three-dimensional distance information between the vehicle and a surrounding structural object or objects such as a person and create local map information including the surrounding information of the current position of the vehicle. Moreover, on the basis of the acquired information, the microcomputer 7610 may predict danger such as collision of the vehicle, approach of a pedestrian or the like or entry into a road where traffic is stopped and generate a warning signal. The warning signal may be, for example, a signal for generating a warning sound or for turning on a warning lamp.

The audio image output unit 7670 transmits an output signal of at least one of a sound or an image to an output apparatus capable of visually or audibly notifying the occupant or the outside of the vehicle of the information. In the example in FIG. 19, an audio speaker 7710, a display unit 7720, and an instrument panel 7730 are exemplified as output apparatuses. The display unit 7720 may include, for example, at least one of an on-board display or a head-up display. The display unit 7720 may have an augmented reality (AR) display function. Besides these apparatuses, the output apparatus may be any of other apparatuses such as a wearable device such as a headphone, or a glasses-type display worn by the occupant, a projector or a lamp. In a case where the output apparatus is a display apparatus, the display apparatus visually displays the results obtained by the various kinds of processing performed by the microcomputer 7610 or the information received from the other control units in various forms such as text, image, table or graph. Moreover, in a case where the output apparatus is an audio output apparatus, the audio output apparatus converts the reproduced audio data or the audio signals including acoustic data or the like into analog signals and audibly output the analog signals.

Note that, in the example shown in FIG. 19, at least two control units connected via the communication network 7010 may be integrated as one control unit. Alternatively, each control unit may be constituted by a plurality of control units. Furthermore, the vehicle control system 7000 may include another control unit not shown. Further, in the above description, some or all of the functions carried by any one of the control units may be possessed by other control units. That is, as long as the information is transmitted and received via the communication network 7010, predetermined arithmetic processing may be performed by any control unit. Similarly, a sensor or an apparatus connected to any one of the control units may be connected to other control units, and the plurality of control units may transmit and receive the detection information to and from each other via the communication network 7010.

The technology according to the present disclosure may be suitably applied to the imaging element constituting the imaging unit 7410 among the constituents described above. By applying the technology according to the present disclosure to the imaging element constituting the imaging unit 7410, a mobile body control system with low power consumption can be realized.

Note that the embodiments of the present disclosure are not limited to the above embodiments, and various modifications can be made in a scope without departing from the gist of the present disclosure.

Furthermore, the present disclosure may also adopt the following configurations.

(1)

A solid-state imaging apparatus including:

an A/D conversion unit that A/D converts a pixel signal; and an oscillator that generates a second internal clock with a frequency lower than that of a first internal clock obtained by multiplying an external clock, in which the A/D conversion unit is configured to operate, when operating by the second internal clock, with resolution lower than resolution of A/D conversion when operating by the first internal clock.

(2)

The solid-state imaging apparatus according to (1), in which the A/D conversion unit has a reference signal generation unit that generates a reference signal compared with the pixel signal, and the reference signal generation unit generates, when operating by the second internal clock, the reference signal that changes with a slope greater than a slope of the reference signal when operating by the first internal clock.

(3)

The solid-state imaging apparatus according to (1) or (2), in which the oscillator has an oscillation circuit, and a frequency of the second internal clock is determined by a resistance value of a resistance element and a capacitance value of a capacitance element, the resistance element and the capacitance element being provided in the oscillation circuit.

(4)

The solid-state imaging apparatus according to (3), in which the oscillator further has a bias circuit.

(5)

The solid-state imaging apparatus according to any one of (1) to (4), further including a controller that controls, when the A/D conversion unit operates by the second internal clock, generation of an activation signal that activates a processor that generates the external clock, in which the A/D conversion unit operates, in a case where the activation signal is generated, by the first internal clock obtained by multiplying the external clock from the processor activated by the activation signal.

(6)

Electronic equipment including a solid-state imaging apparatus having:

an A/D conversion unit that A/D converts a pixel signal; and an oscillator that generates a second internal clock with a frequency lower than that of a first internal clock obtained by multiplying an external clock, in which the A/D conversion unit is configured to operate, when operating by the second internal clock, with resolution lower than resolution of A/D conversion when operating by the first internal clock.

(7)

A solid-state imaging apparatus including:

an A/D conversion unit that A/D converts a pixel signal;

a first oscillator that generates a first internal clock; and a second oscillator that generates a second internal clock with a frequency higher than that of the first internal clock, in which the second oscillator is configured to be activated only during an A/D conversion period, in which the A/D conversion unit operates, and operates by the second internal clock during the A/D conversion period.

(8)

The solid-state imaging apparatus according to (7), in which the solid-state imaging apparatus operates by an external clock with a frequency higher than that of the second internal clock during an operation period of a first operation mode, operates by the first internal clock during an operation period of a second operation mode, in which shooting is performed with resolution lower than that of shooting in the first operation mode, except for the A/D conversion period, and operates by the second internal clock during the A/D conversion period of the operation period of the second operation mode.

(9)

The solid-state imaging apparatus according to (8), in which the first oscillator is constantly activated at least during the period of the second operation mode.

(10)

The solid-state imaging apparatus according to any one of (7) to (9), in which the first oscillator and the second oscillator are arranged at positions spaced apart from each other on a substrate.

(11)

The solid-state imaging apparatus according to (10), in which the second oscillator is arranged in a vicinity of the A/D conversion unit.

(12)

The solid-state imaging apparatus according to (10) or (11), in which a power source and GND of the first oscillator and a power source and GND of the second oscillator are electrically separated from each other.

(13)

Electronic equipment having:

an A/D conversion unit that A/D converts a pixel signal;

a first oscillator that generates a first internal clock; and a second oscillator that generates a second internal clock with a frequency higher than that of the first internal clock, in which the second oscillator is configured to be activated only during an A/D conversion period, in which the A/D conversion unit operates, and operates by the second internal clock during the A/D conversion period.

REFERENCE SIGNS LIST

11 CMOS image sensor
12 DSP
21 Pixel
22 Row driver
23 ADC
24 Controller
25 PLL circuit
26 Oscillator
31 DAC
32 Comparator
33 Counter
71 Oscillation circuit
72 Bias circuit
111 First oscillator
112 Second oscillator
200 Electronic equipment
203 Solid-state imaging apparatus

The invention claimed is:

1. A solid-state imaging apparatus, comprising:
   an analog to digital (A/D) conversion unit configured to convert a pixel signal into a digital signal, wherein the A/D conversion unit comprises a plurality of binary counters; and
   an oscillator configured to generate a second internal clock, wherein
      a frequency of the second internal clock is lower than a frequency of a first internal clock,
      the first internal clock is obtained by multiplication of an external clock with a determine frequency, and
      the A/D conversion unit is further configured to halt a count operation of one of the plurality of binary counters in an A/D conversion operation by the second internal clock, such that a first resolution of the A/D conversion unit in the A/D conversion operation by the second internal clock is lower than a second resolution of the A/D conversion unit in the A/D conversion operation by the first internal clock.

2. The solid-state imaging apparatus according to claim 1, wherein
   the A/D conversion unit further comprises a reference signal generation unit configured to generate a reference signal,
   the A/D conversion unit is further configured to compare the reference signal with the pixel signal, and
   the reference signal generation unit is configured to generate the reference signal such that a slope of the reference signal, generated in the A/D conversion operation by the second internal clock, is greater than a slope of the reference signal generated in the A/D conversion operation by the first internal clock.

3. The solid-state imaging apparatus according to claim 1, wherein
   the oscillator comprises an oscillation circuit,
   the oscillation circuit comprises a resistance element and a capacitance element, and
   the oscillation circuit is configured to determine the frequency of the second internal clock based on a resistance value of the resistance element and a capacitance value of the capacitance element.

4. The solid-state imaging apparatus according to claim 3, wherein the oscillator further comprises a bias circuit.

5. The solid-state imaging apparatus according to claim 1, further comprising a controller configured to control generation of an activation signal in the A/D conversion operation by the second internal clock, wherein
   the activation signal activates a processor configured to generate the external clock, and
   the A/D conversion unit is configured to resume operation in the A/D conversion operation by the first internal clock based on the generation of the activation signal.

6. An electronic equipment, comprising:
   a solid-state imaging apparatus, comprising:
      an analog to digital (A/D) conversion unit configured to convert a pixel signal into a digital signal, wherein the A/D conversion unit comprises a plurality of binary counters; and
      an oscillator configured to generate a second internal clock, wherein
         a frequency of the second internal clock is lower than a frequency of a first internal clock,
         the first internal clock is obtained by multiplication of an external clock by a determined frequency, and
         the A/D conversion unit is further configured to halt a count operation of one of the plurality of binary counters in an A/D conversion operation by the second internal clock, such that a first resolution of the A/D conversion unit in the A/D conversion operation by the second internal clock is lower than a second resolution of the A/D conversion unit in the A/D conversion operation by the first internal clock.

7. A solid-state imaging apparatus, comprising:
   an analog to digital (A/D) conversion unit configured to convert a pixel signal into a digital signal, wherein the A/D conversion unit comprises a plurality of binary counters;
   a first oscillator configured to generate a first internal clock; and
   a second oscillator configured to generate a second internal clock with a frequency higher than a frequency of the first internal clock,
   wherein
      the second oscillator is configured to be activated during an A/D conversion period, in which the A/D conversion unit operates by the second internal clock, and
      the A/D conversion unit is configured to halt a count operation of one of the plurality of binary counters in an A/D conversion operation by the second internal clock, such that a first resolution of the A/D conversion unit in the A/D conversion operation by the second internal clock is lower than a second resolution of the A/D conversion unit in the A/D conversion operation by the first internal clock.

8. The solid-state imaging apparatus according to claim 7, wherein the solid-state imaging apparatus is configured to:
   operate by an external clock with a frequency higher than the frequency of the second internal clock during an operation period of a first operation mode,
   operate by the first internal clock during an operation period of a second operation mode, in which a shooting operation is executed with a resolution lower than that of a shooting operation in the first operation mode, except for the A/D conversion period, and
   operate by the second internal clock during the A/D conversion period of the operation period of the second operation mode.

9. The solid-state imaging apparatus according to claim 8, wherein the first oscillator is constantly activated at least during the operation period of the second operation mode.

10. The solid-state imaging apparatus according to claim 9, wherein
    the first oscillator and the second oscillator are on a substrate, and
    the first oscillator is spaced apart from the second oscillator.

11. The solid-state imaging apparatus according to claim 10, wherein the second oscillator is in a vicinity of the A/D conversion unit.

12. The solid-state imaging apparatus according to claim 10, wherein a power source and ground (GND) of the first oscillator are electrically separated from a power source and GND of the second oscillator, respectively.

13. An electronic equipment, comprising:
    an analog to digital (A/D) conversion unit configured to convert a pixel signal into a digital signal, wherein the A/D conversion unit comprises a plurality of binary counters;

a first oscillator configured to generate a first internal clock; and a second oscillator configured to generate a second internal clock with a frequency higher than a frequency of the first internal clock, wherein the second oscillator is configured to be activated during an A/D conversion period, in which the A/D conversion unit operates by the second internal clock, and the A/D conversion unit is further configured to halt a count operation of one of the plurality of binary counters in an A/D conversion operation by the second internal clock, such that a first resolution of the A/D conversion unit in the A/D conversion operation by the second internal clock is lower than a second resolution of the A/D conversion unit in the A/D conversion operation by the first internal clock.

\* \* \* \* \*